US008288284B2

(12) United States Patent  
Arita et al.

(10) Patent No.: US 8,288,284 B2  
(45) Date of Patent: Oct. 16, 2012

(54) SUBSTRATE PROCESSING METHOD, SEMICONDUCTOR CHIP MANUFACTURING METHOD, AND RESIN-ADHESIVE-LAYER-BACKED SEMICONDUCTOR CHIP MANUFACTURING METHOD

(75) Inventors: Kiyoshi Arita, Osaka (JP); Hiroshi Haji, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/255,582

(22) PCT Filed: Apr. 9, 2010

(86) PCT No.: PCT/JP2010/002628  
§ 371 (c)(1),  
(2), (4) Date: Sep. 9, 2011

(87) PCT Pub. No.: WO2010/116766  
PCT Pub. Date: Oct. 14, 2010

(65) Prior Publication Data  
US 2012/0021608 A1    Jan. 26, 2012

(30) Foreign Application Priority Data

Apr. 10, 2009    (JP) ................................. 2009-095800

(51) Int. Cl.  
*B44C 1/22* (2006.01)  
*C03C 15/00* (2006.01)  
*C03C 25/68* (2006.01)  
*C23F 1/00* (2006.01)  
*H01L 21/311* (2006.01)

(52) U.S. Cl. ............... 438/703; 216/41; 216/49; 216/63

(58) Field of Classification Search ................... None  
See application file for complete search history.

(56) References Cited

U.S. PATENT DOCUMENTS 5,597,422 A * 1/1997 Kataoka et al. ............... 136/259  
(Continued)

FOREIGN PATENT DOCUMENTS

JP    2004-172364 A    6/2004  
(Continued)

OTHER PUBLICATIONS

International Search Report for PCT/JP2010/002628 dated May 25, 2010.

*Primary Examiner* — Seahvosh Nikmanesh  
*Assistant Examiner* — Evren Seven  
(74) *Attorney, Agent, or Firm* — Pearne & Gordon LLP

(57) ABSTRACT

To provide a substrate processing method and a semiconductor chip manufacturing method that enable low-cost formation of a mask for etching using plasma etching. During formation of a mask used in plasma dicing for separating a semiconductor wafer 1 into discrete semiconductor chips 1e by means of etching using plasma processing, there is adopted a method including printing a lyophobic liquid in an area on a rear surface 1b that is to be an objective of etching, thereby forming a lyophobic pattern made up of lyophobic films 3; supplying a low viscosity resin 4a and a high viscosity resin 4b, in this sequence, to the rear surface 1b on which the lyophobic pattern is formed, thereby forming a resin film 4 that is thicker than the lyophobic films 3 in an area where the lyophobic films 3 are not present; and curing the resin film 4, to thus form a mask 4\* that covers an area except for the area to be etched. Thus, a mask for etching purpose can be formed at low cost without use of a high-cost method, like photolithography.

12 Claims, 12 Drawing Sheets

U.S. PATENT DOCUMENTS

| | | | | |
|---|---|---|---|---|
| 6,087,196 | A * | 7/2000 | Sturm et al. | 438/29 |
| 6,838,361 | B2 * | 1/2005 | Takeo | 438/493 |
| 8,053,171 | B2 * | 11/2011 | Maekawa et al. | 430/311 |
| 2004/0102025 | A1 | 5/2004 | Arita | |
| 2004/0121611 | A1 | 6/2004 | Arita | |
| 2005/0173065 | A1 | 8/2005 | Arita | |
| 2006/0088983 | A1 | 4/2006 | Fujisawa et al. | |

FOREIGN PATENT DOCUMENTS

| | | |
|---|---|---|
| JP | 2004-193305 A | 7/2004 |
| JP | 2005-191039 A | 7/2005 |
| JP | 2006-120834 A | 5/2006 |
| JP | 2006-210577 A | 8/2006 |

* cited by examiner

CROSS SECTION TAKEN ALONG LINE A-A

SUBSTRATE PROCESSING METHOD, SEMICONDUCTOR CHIP MANUFACTURING METHOD, AND RESIN-ADHESIVE-LAYER-BACKED SEMICONDUCTOR CHIP MANUFACTURING METHOD

TECHNICAL FIELD

The present invention relates to a substrate processing method for partially eliminating a substrate, like a semiconductor wafer, a semiconductor chip manufacturing method to which the substrate processing method is applied, and a resin-adhesive-layer-backed semiconductor chip manufacturing method.

BACKGROUND ART

A semiconductor device to be mounted on a substrate of electronic equipment is manufactured by means of slicing into pieces a semiconductor chip made up of discrete semiconductor devices from a semiconductor wafer, wherein integrated circuits are fabricated in the respective discrete semiconductor devices in a wafer state. With a recent increase in the degree of difficulty in handling a semiconductor chip resultant from a decrease in thickness of the semiconductor chip, there has been proposed plasma dicing for dicing a semiconductor wafer into pieces of semiconductor chips by means of plasma etching.

Plasma dicing is to etch a semiconductor wafer by means of plasma while the semiconductor wafer except for scribe lines showing grid-shaped split positions is masked by means of a resist film, thereby cutting the semiconductor wafer along the scribe lines. Therefore, plasma dicing requires a step of making a mask over the semiconductor wafer. A mask has heretofore been made by means of a photolithography (see Patent Document 1) for transferring a scribe line pattern by use of a photosensitive material or a method (see Patent Document 2) for eliminating a scribe line area on a mask layer formed over a surface of a semiconductor wafer by irradiation of a laser beam to thereby make a mask.

RELATED ART DOCUMENT

Patent Documents

Patent Document 1: JP-A-2004-172364
Patent Document 2: JP-A-2005-191039

DISCLOSURE OF THE INVENTION

Problem that the Invention is to Solve

However, the foregoing related art examples encounter a problem of mask formation involving consumption of high cost. Specifically, the photolithography technique is originally intended for a high precision pattern, such as an integrated circuit and requires complicate steps and expensive facilities, which inevitably entails a cost rise. Forming a mask by use of a laser beam entails facility cost for laser beam irradiation, which poses difficulty in forming a mask at low cost. The problems pertaining to mask formation are not limited solely to plasma dicing and are also true for various processing operations utilizing an application of plasma etching; for instance, processing for making via holes in a substrate, processing intended for a substrate for use with a MEMS (Microelectromechanical System), and a substrate processing method for fabricating integrated circuits on a transparent display panel, and the like.

Accordingly, the present invention aims at providing a substrate processing method that enables inexpensive formation of a mask for etching using plasma processing, a semiconductor chip manufacturing method utilizing an application of the substrate processing method, and a resin-adhesive-layer-backed semiconductor chip manufacturing method.

Means for Solving the Problem

A substrate processing method of the present invention is directed toward a substrate processing method for partially eliminating a substrate by etching using plasma processing, the method comprising:

a lyophobic pattern formation step of printing a lyophobic liquid to an area to be etched away on a processing target surface of the substrate, thereby forming a lyophobic pattern;

a resin film formation step of preparing two types of liquids, or a first liquid including at least a solvent and a resin and a second liquid whose viscosity is lower than a viscosity of the first liquid and supplying the liquids in descending sequence of the second liquid and the first liquid to the processing target surface of the substrate on which the lyophobic pattern is formed, thereby forming a resin film that is thicker than the lyophobic pattern in an area where the lyophobic pattern is not formed;

a mask formation step of curing the resin film, to thus form on the processing target surface a mask for covering an area except for the area to be etched away;

a lyophobic pattern removal step of removing the lyophobic pattern from the processing target surface after performance of processing pertaining to the mask formation step;

an etching step of etching the substrate from the processing target surface thereof using plasma processing after processing pertaining to the lyophobic pattern removal step; and a mask removal step of removing the mask from the processing target surface after completion of processing pertaining to the etching step.

A semiconductor chip manufacturing method of the present invention is directed toward a semiconductor chip manufacturing method for separating a semiconductor wafer, which has a plurality of semiconductor devices on a circuit fabrication surface and which is affixed with a protective sheet for protecting the circuit fabrication surface by means of etching using plasma processing, into semiconductor chips made up of respective semiconductor devices, the method comprising:

a lyophobic pattern formation step of printing a lyophobic liquid on scribe lines serving as borders between semiconductor chips on a processing target surface of the semiconductor wafer that is another side of the circuit fabrication surface, thereby forming a lyophobic pattern;

a resin film formation step of preparing two types of liquids, or a first liquid including at least a solvent and a resin and a second liquid whose viscosity is lower than a viscosity of the first liquid and supplying the liquids in descending sequence of the second liquid and the first liquid to the processing target surface of the substrate on which the lyophobic pattern is formed, thereby forming a resin film that is thicker than the lyophobic pattern in an area where the lyophobic pattern is not formed;

a mask formation step of curing the resin film, to thus form on the processing target surface a mask for covering an area except for the area to be etched away;

a lyophobic pattern removal step of removing the lyophobic pattern from the processing target surface after performance of processing pertaining to the mask formation step;

an etching step of etching the semiconductor wafer from the processing target surface thereof until the protective sheet becomes exposed on the processing target surface, after processing pertaining to the lyophobic pattern removal step; and a mask removal step of removing the mask from the processing target surface after completion of processing pertaining to the etching step.

A resin-adhesive-layer-backed semiconductor chip manufacturing method is directed toward a resin-adhesive-layer-backed semiconductor chip manufacturing method for manufacturing semiconductor chips having on rear surfaces resin adhesive layers for die-bonding purpose by means of plasma dicing for separating a semiconductor wafer, which has a plurality of semiconductor devices on a circuit fabrication surface and which is affixed with a protective sheet for protecting the circuit fabrication surface, into respective semiconductor devices by means of etching using plasma processing, the method comprising:

a lyophobic pattern formation step of printing a lyophobic liquid on scribe lines serving as borders between semiconductor chips on a rear surface that is another side of the circuit fabrication surface of the semiconductor wafer, thereby forming a lyophobic pattern;

a resin film formation step of preparing two types of liquids, or a first liquid including at least a solvent and a resin and a second liquid whose viscosity is lower than a viscosity of the first liquid and supplying the liquids in descending sequence of the second liquid and the first liquid to the processing target surface of the substrate on which the lyophobic pattern is formed, thereby forming a resin film that is thicker than the lyophobic pattern in an area where the lyophobic pattern is not formed;

a resin adhesive layer formation step of semi-curing the resin film, to thus form a resin adhesive layer;

a lyophobic pattern removal step of removing the lyophobic pattern from the rear surface after performance of processing pertaining to the resin adhesive layer formation step; and an etching step of etching, after performance of processing pertaining to the lyophobic pattern removal step, the semiconductor wafer from the rear surface thereof while the resin adhesive layer is taken as a mask until the protective sheet becomes exposed on the rear surface.

Advantages of the Invention

According to the present invention, during mask formation implemented by etching using plasma processing, there is adopted a method including printing a lyophobic liquid in an area to be etched on the processing target surface, thereby forming the lyophobic pattern; preparing two types of liquids; namely, the first liquid including at least a solvent and a resin, and the second liquid whose viscosity is lower than that of the first liquid; supplying the liquids, in descending sequence of the second liquid and the first liquid, to the processing target surface of the substrate over which the lyophobic pattern is already formed, to thus form the resin film that is thicker than the lyophobic pattern on the area where the lyophobic pattern is not formed; and curing the resin film, to thus form a mask that covers an area of the semiconductor wafer except the area to be etched. Thus, a mask for etching using plasma processing can be formed at low cost without use of a high-cost method, like photolithography.

Further, according to the present invention, during manufacture of semiconductor chips for separating a semiconductor wafer into semiconductor chips formed from respective semiconductor devices by means of etching using plasma processing, there is adopted a method including printing a lyophobic liquid in an area to be etched on a processing target surface, thereby forming the lyophobic pattern; preparing two types of liquids; namely, the first liquid including at least a solvent and a resin, and the second liquid whose viscosity is lower than that of the first liquid; supplying the liquids, in descending sequence of the second liquid and the first liquid, to the processing target surface of the semiconductor wafer over which the lyophobic pattern is already formed, to thus form the resin film that is thicker than the lyophobic pattern on the area where the lyophobic pattern is not formed; and curing the resin film, to thus form a mask that covers an area of the semiconductor wafer except the area to be etched. Thus, a mask for etching using plasma processing is formed at low cost, so that semiconductor chips can be manufactured at low cost.

Moreover, according to the present invention, during manufacture of semiconductor chips for separating a semiconductor wafer into semiconductor chips with resin adhesive layers formed from respective semiconductor devices by means of etching using plasma processing, there is adopted a method including printing a lyophobic liquid on scribe lines, which are borders between semiconductor chips, on a rear surface that is another side of a circuit fabrication surface of the semiconductor wafer, thereby forming the lyophobic pattern; preparing two types of liquids; namely, the first liquid including at least a solvent and a resin, and the second liquid whose viscosity is lower than that of the first liquid; supplying the liquids, in descending sequence of the second liquid and the first liquid, to the processing target surface of the semiconductor wafer over which the lyophobic pattern is already formed, to thus form the resin film that is thicker than the lyophobic pattern on the area where the lyophobic pattern is not formed; semi-curing the resin film, to thus form a resin adhesive layer; and etching the rear surface of the semiconductor wafer while the resin adhesive layer is taken as a mask after removal of the lyophobic pattern from the rear surface. Thus, a mask for etching using plasma processing is formed at low cost, and the mask can be used as the resin adhesive layer for die-bonding.

EMBODIMENTS FOR IMPLEMENTING THE INVENTION

First Embodiment

Figure 1:
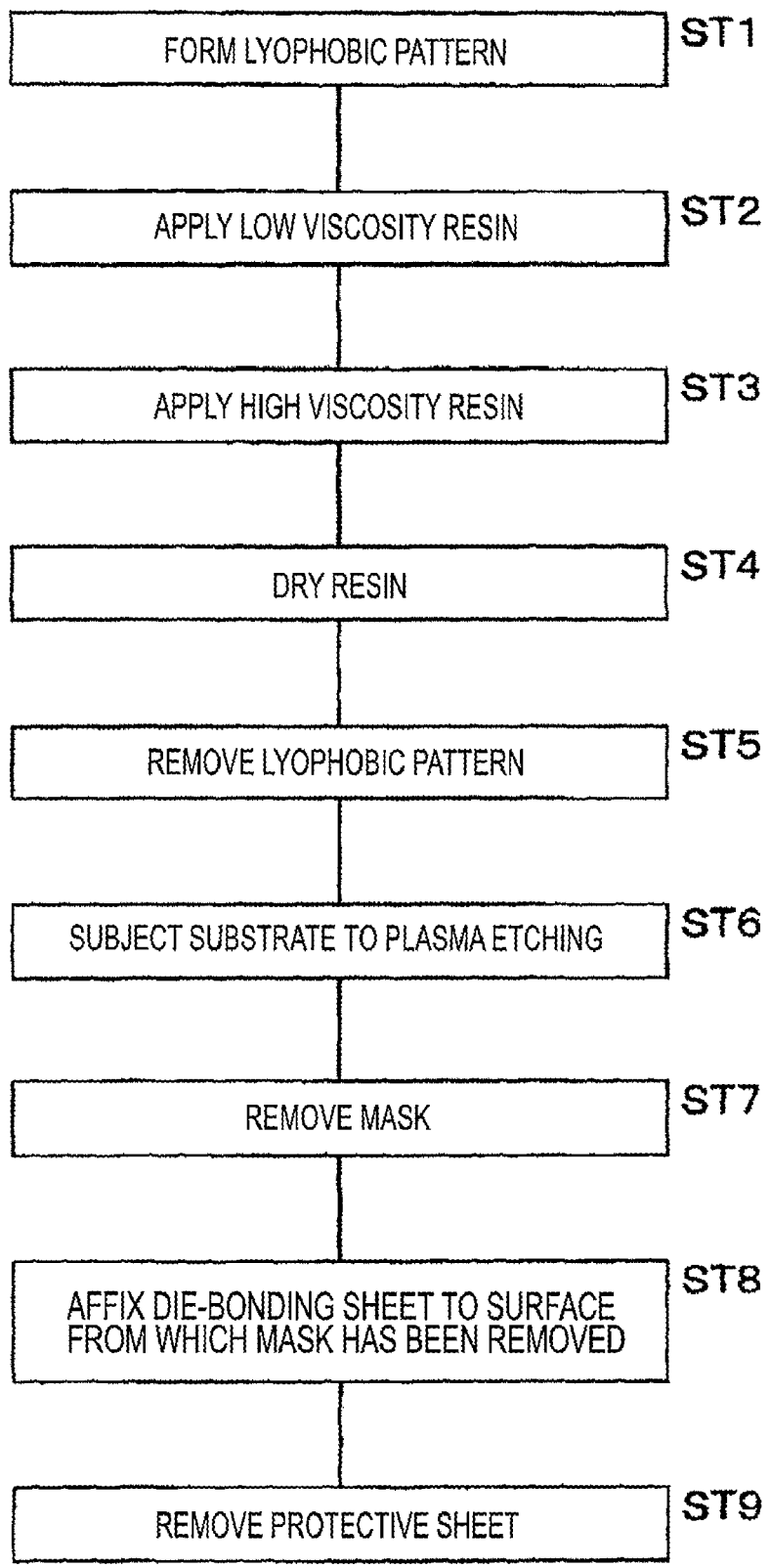
FIG. 1 is a flowchart showing a semiconductor chip manufacturing method utilizing an application of a substrate processing method of a first embodiment of the present invention.

First, a lyophobic pattern and a mask of the present embodiment are described. In the present embodiment, during mask formation that is performed at the occasion of etching utilizing plasma processing for separating a semiconductor wafer, a lyophobic pattern is formed by means of a resin (a lyophobic agent) that exhibits a lyophobic property with respect to a solvent included in a liquid resin that is to work as a material making up a mask. Specifically, a lyophobic pattern is formed in advance over an area of the semiconductor wafer, except for an area where a mask is to be made, by use of the lyophobic agent. A liquid resin that makes a mask is caused to adhere to only the area where the mask is to be made. On the occasion of formation of the lyophobic pattern, a liquid (a lyophobic liquid) made by dissolving the lyophobic agent in a solvent is printed in a predetermined pattern by means of transfer printing, screen printing, dispensing, inkjet printing, or the like. A solvent component is volatized after printing, whereupon the lyophobic pattern is completed.

A resin (resist) that will not be eliminated by a fluorine-based gas plasma and that is easily removed (ashed) by means of oxygen or an oxygen-contained gas plasma is used as a material making up the mask. Hydrocarbon-based resins have been used as resins exhibiting these properties. On the occasion of mask formation, a liquid resin made by dissolving a resist in a solvent is applied over a processing target surface of a substrate over which the lyophobic pattern has been formed, by means of a method like dispensing, inkjet printing, and spin coating. Since the lyophobic agent repels the solvent of the liquid resin applied over the processing target surface, the liquid resin spreads over only an area of the processing target surface except for the lyophobic pattern. The solvent of the liquid resin is volatized in a baking step, thereby letting the resist adhere the processing target surface. A mask patterned by the lyophobic pattern is thereby completed.

The present invention adopting such a mask formation method involves a requirement that the lyophobic agent used for making the lyophobic pattern be a combination exhibiting a lyophobic property with respect to the solvent included in the liquid resin used for mask formation. In addition, a solvent capable of blending with a resin that is to serve as a resist must be chosen as a solvent. In general, two types of chemicals have properties of easily blending with each other as SP values (solubility parameters) of the respective chemicals are more analogous to each other and repelling each other as the SP values increasingly differ from each other. Therefore, when the resist to be used is any of the hydrocarbon-based resins (having an SP value of 7.0 to 8.0), any of saturated-hydrocarbon-based solvents having an SP value of 7.0 to 8.0 is chosen as a solvent.

In relation to a choice of a lyophobic agent and a solvent used with a liquid resin, there are chosen substances corresponding to a combination of substances having different SP values, preferably a combination of substances whose SP values differ from each other by a value of 1.0 or more. Therefore, if the solvent is any of saturated-hydrocarbon-based solvents (having an SP value of 7.0 to 8.0), any of acrylic resins (having an SP value of 9.2) or fluorine-based resins (having an SP value of 3.6) can be used as a lyophobic agent. Further, when any of saturated-hydrocarbon-based solvents having an SP value of 8.0 is used, a silicone-based resin (having an SP value of 7.0) can be used as a lyophobic agent. As mentioned above, a substance whose SP value differs from an SP value of the solvent used for a liquid resin by a value of 1.0 or more is used as a lyophobic agent, whereby a liquid resin used for mask formation can be easily arranged on the processing target surface except for the lyophobic pattern.

Mask formation using the lyophobic pattern requires a uniform supply of a liquid resin over the area of the processing target surface surrounded by the lyophobic pattern without occurrence of a two-dimensional gap on a border between the lyophobic pattern and the area. However, mere application of a liquid resin causes a problem caused by a viscosity of the liquid resin, such as that described below, which poses a difficulty in forming a mask having a good shape. Specifically, when the viscosity of the liquid resin is high, a supplied liquid resin attempts to gather together into as simple a shape as possible because of surface tension. For this reason, the liquid resin hardly enters an indentation of a corner on the processing target surface where the lyophobic pattern has a cross. A two-dimensional void that is not supplied with a resin tends to occur in only the indentation.

On the contrary, when the viscosity of the liquid resin is low, the resin easily spreads in a wet fashion over the processing target surface when supplied in a liquid state. However, during a stage where the solvent component of the resin evaporates, to thus cure the resin, the resin cannot maintain a desirable mask shape. Specifically, since a concentration of a solid resin component of the liquid resin whose viscosity is set to a low level is low, the resin changes in the course of evaporation of the solvent in such a way that a two-dimensional shape as well as a thicknesswise shape of the resin contract. For this reason, in a state where the liquid resin is supplied by application, the resin remains uniformly spread in a wet fashion over the area surrounded by the lyophobic pattern. However, when the resin becomes cured as a result of evaporation of the solvent, the two-dimensional shape of the resin becomes contracted. Therefore, a two-dimensional void devoid of a resin occurs on the border between the lyophobic pattern and the area in the same way as mentioned previously.

Such a failure in the shape of the mask attributable to the viscosity of the liquid resin is ascribable to surface tension of the resin when the resin has a high viscosity and contractive deformation resultant from evaporation of the solvent when the resin has a low viscosity. Therefore, it is extremely difficult to determine an appropriate viscosity range that enables prevention of occurrence of such a failure in shape. Accordingly, in the present embodiment, two types of liquids having different viscosity levels are prepared in a process of a mask being formed from a liquid resin as will be described below, and the liquids are supplied in two steps. Specifically, prior to supplying a high viscosity resin (a first liquid) including a resin component, which is to make a mask, in a high concentration, a low viscosity resin (a second liquid) that exhibits a viscosity lower than that of the high viscosity resin is first supplied. The low viscosity resin is thus caused to spread uniformly in a wet fashion within an area surrounded by the lyophobic pattern. Next, the high viscosity resin is supplied, to thus assure a quantity of resin component required to form a mask.

Figure 2:
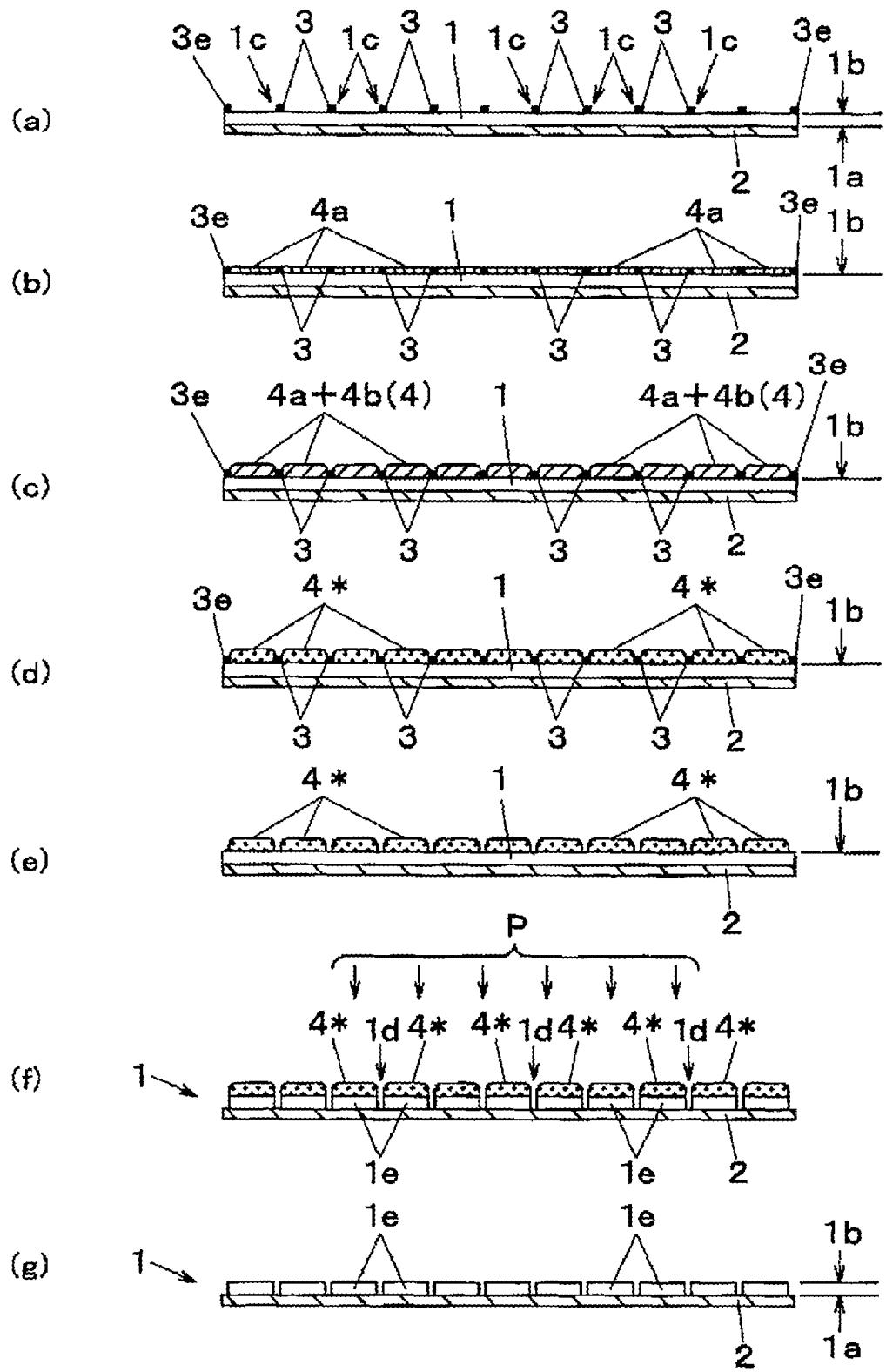
FIGS. 2 (a) to (g) are explanatory process charts of the semiconductor chip manufacturing method and a semiconductor chip boding method that utilize the application of the substrate processing method of the first embodiment of the present invention.
Figure 3:
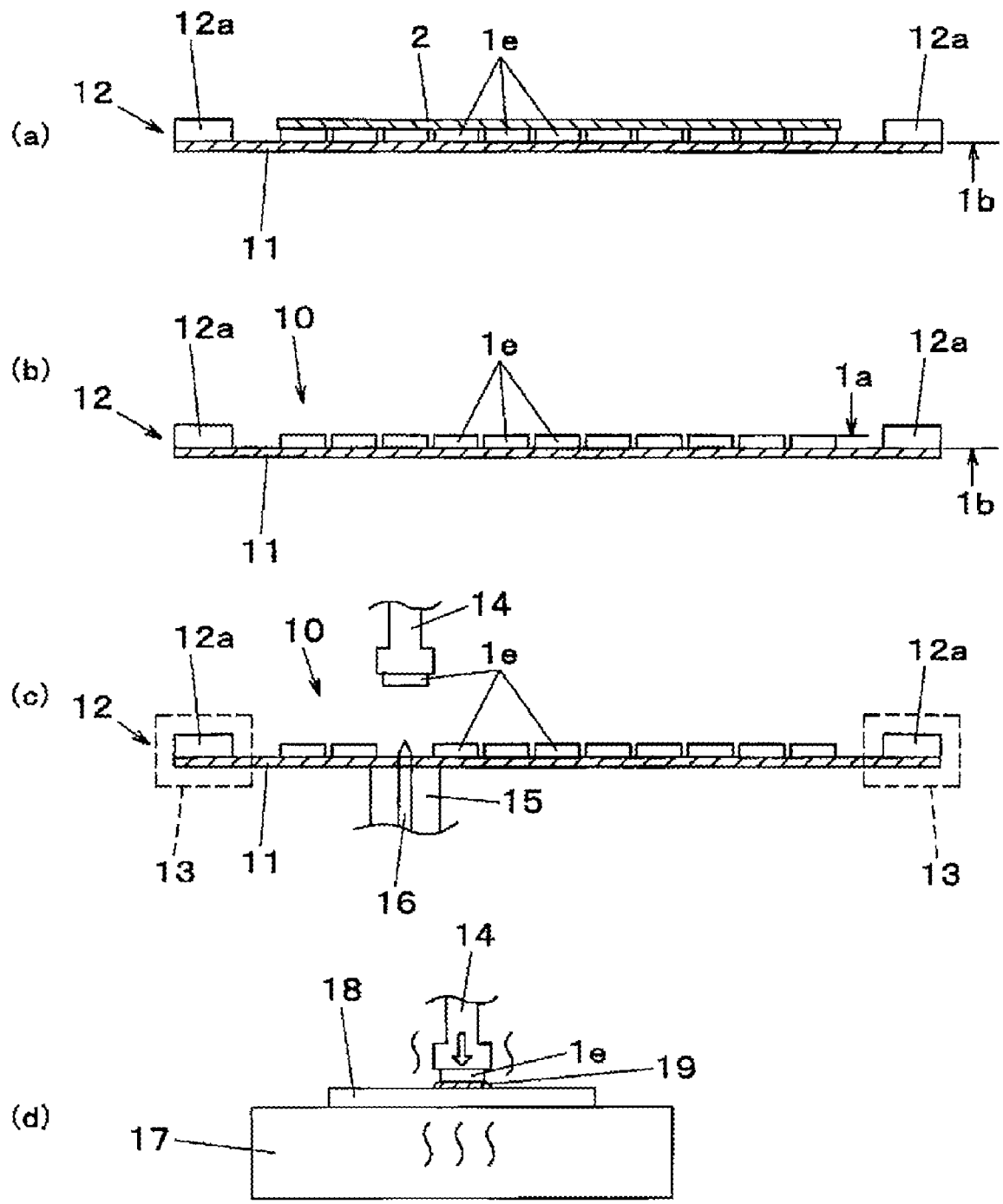
FIGS. 3 (a) to (d) are explanatory process charts of the semiconductor chip manufacturing method and the semiconductor chip boding method that utilize the application of the substrate processing method of the first embodiment of the present invention.

The substrate processing method is now described by reference to the flowchart of FIG. 1 and explanatory process charts of FIGS. 2 and 3. The substrate processing method is to partially eliminate a material making up the substrate through performance of etching using plasma processing. Plasma dicing is hereinbelow provided as example substrate processing; in other words, a semiconductor wafer separated into a plurality of semiconductor devices by means of scribe lines is taken as a substrate, and the scribe lines are partially eliminated by means of etching using a plasma, thereby separating the semiconductor wafer into discrete semiconductor chips. The first embodiment, in a word, shows a semiconductor chip manufacturing method for separating a semiconductor wafer, which has a plurality of semiconductor devices on a circuit fabrication surface and a protective sheet for protecting the circuit fabrication surface affixed to the circuit fabrication surface, into semiconductor chips made up of respective semiconductor devices, by means of etching using plasma processing.

In FIG. 1, a lyophobic pattern is first made over a semiconductor wafer 1 serving as a substrate (ST1). As shown in FIG. 2(a), a plurality of semiconductor chips including integrated circuits (semiconductor devices) are fabricated on the semiconductor wafer 1. A protective sheet 2 for protecting the integrated circuits is affixed to a circuit fabrication surface 1a of the semiconductor wafer 1 where the integrated circuits are fabricated. A rear surface 1b that is the other side of the circuit fabrication surface 1a is made thin to a thickness of 100 micrometers or less by means of removing a surface layer in a thinning step, which is a preceding step, through performance of mechanical grinding.

Figure 4:
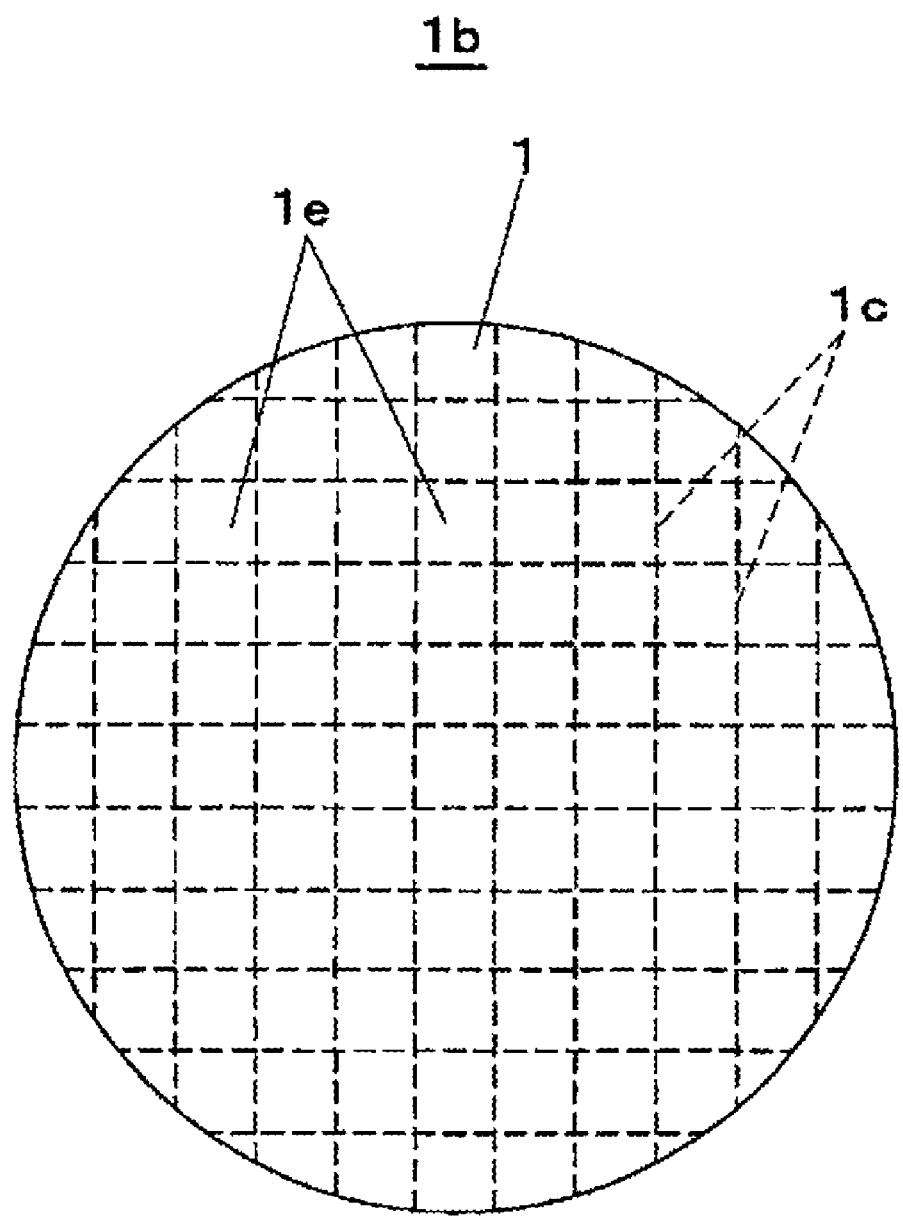
FIG. 4 is a plan view of a semiconductor wafer that is an object of the substrate processing method of the first embodiment of the present invention.
Figure 5:
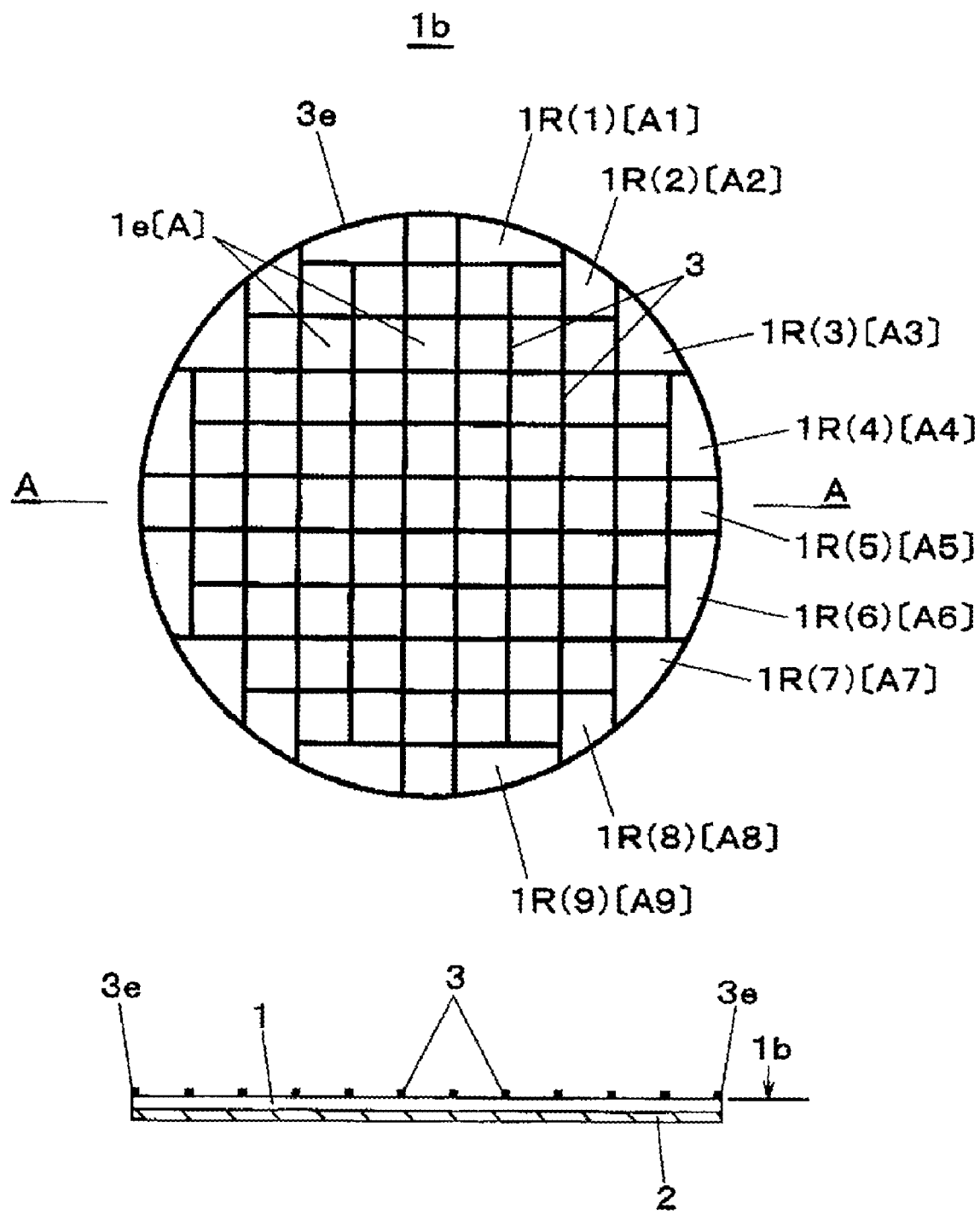
FIG. 5 is a plan view of the semiconductor wafer that is an object of the substrate processing method of the first embodiment of the present invention.

Next, as shown in FIG. 2(b), a lyophobic pattern is formed on the rear surface 1b (corresponding to the processing target surface of the substrate to be etched) of the semiconductor wafer 1, along grid lines (corresponding to areas to be etched away) corresponding to scribe lines 1c (see FIG. 4) that separate the semiconductor wafer 1 into respective semiconductor chips 1e and along a contour [see FIG. 2(a) and a lyophobic film 3e shown in FIG. 5] set to a predetermined width along an outer edge of the semiconductor wafer 1 (a lyophobic pattern formation step). In addition to being formed along the grid lines corresponding to the scribe lines 1c (see FIG. 4), the lyophobic pattern is formed along the contour of the outer edge of the semiconductor wafer 1. The lyophobic pattern formed along the contour is intended to prevent the liquid resin from running over the outer edge of the semiconductor wafer 1 to thereby fall from the wafer, which would otherwise occur when the liquid resin is applied after formation of the lyophobic pattern. The lyophobic pattern formation step includes a print step of printing a lyophobic liquid in a predetermined pattern on the processing target surface and a baking step of letting a solvent component of the printed lyophobic liquid evaporate, to thus cause the lyophobic agent to adhere to the processing target surface, to thus produce the lyophobic film 3.

Figure 6:
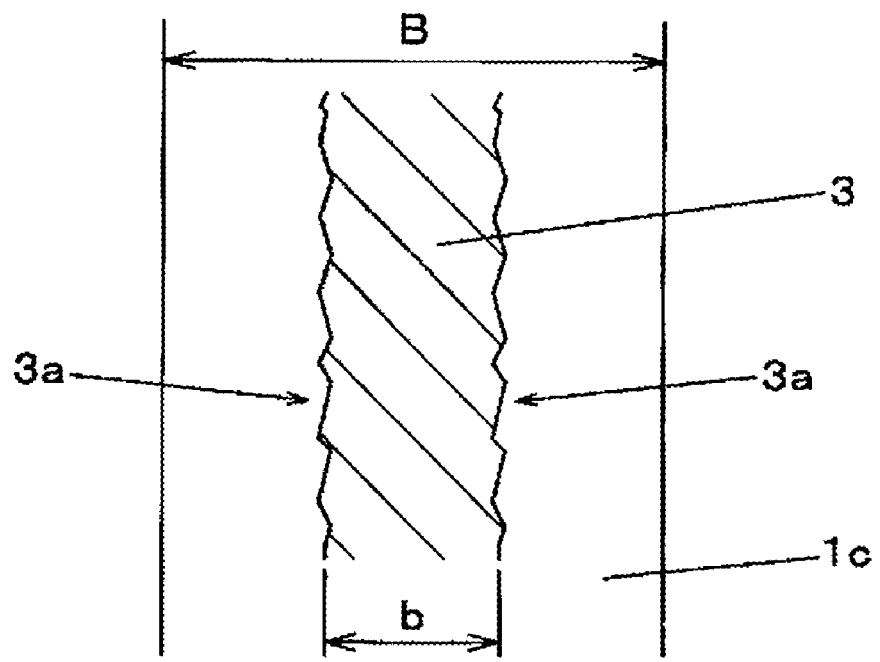
FIG. 6 is an enlarged view of a lyophobic pattern of the substrate processing method of the first embodiment of the present invention.

In the print step, a method that enables linear supply of a lyophobic liquid, such as transfer printing, screen printing, dispensing, and inkjet printing, is employed. Specifically, as shown in FIG. 6, a liquid that is to form the lyophobic film 3 is printed in a grid shape of the scribe lines 1c to a print width "b" (about 20 micrometers) within a range of the width of each of the scribe lines 1c set in consideration of a dicing margin having a separation width B (about 50 micrometers to 60 micrometers). Moreover, a liquid that is to form a lyophobic film 3e is printed in a circumferential pattern along the contour that is set along the outer edge of the semiconductor wafer 1 to a predetermined width corresponding to the print width "b." At this time, an essential requirement for a widthwise position of the lyophobic film 3 is that the lyophobic film 3 should fall within a range of the separation width B of each of the scribe lines 1c. Therefore, a widthwise positional error of about ±20 micrometers is allowed. A widthwise edge 3a on either side of the lyophobic film 3 does not require a high degree of linear accuracy. Even when the edge exhibits a wavelike shape to some extent, the edges do not cause any problem. Likewise, the lyophobic film 3e does not require a widthwise positional accuracy, either, and is allowed to exhibit a wavelike shape to some extent.

The lyophobic pattern formed along a periphery of the outer edge of the semiconductor wafer 1 is now described in detail. As shown in FIG. 6, in relation to the scribe lines 1c (FIG. 4) that separate normal semiconductor chips 1e in the semiconductor wafer 1, the lyophobic film 3 is orderly printed in a grid shape. On the contrary, the lyophobic film 3 is not always printed along the grid lines shown in FIG. 4 in the vicinity of a contour of the outer edge of the semiconductor wafer 1. Depending on a size of squares surrounded by inner lyophobic films 3 and the lyophobic film 3e of the contour, printing the lyophobic films 3 is omitted. Specifically, when the lyophobic pattern is formed by printing the lyophobic films 3 along the grid lines and when areas of respective squares surrounded by the grid-like lyophobic films 3 and the lyophobic film 3e of the outer edge are too small to efficiently apply a resin, printing the lyophobic films 3 along the grid lines corresponding to borders between the current square and adjoining squares is omitted to unite the square with the adjoining square.

In FIG. 5, in relation to much of outer edge squares 1R(1) to 1R(9) defined by areas surrounded by the lyophobic film 3e formed along the contour of the semiconductor wafer 1 and the lyophobic films 3 printed in grid lines, some of the lyophobic films 3 corresponding to the grid lines are omitted, and adjoining two squares unite with each other, thereby forming one square. As a result, areas [A1] to [A9] of the respective outer edge squares 1R(1) to 1R(9) do not much differ from an area [A] of the normal semiconductor chip 1e separated by the scribe lines 1c. Occurrence of excessive variations in required quantity of liquid resin applied, which will be described later, can be prevented. Alternatively, it is also possible to calculate the area [A] of the semiconductor chip 1e and the respective areas [A1] to [A9] of the outer edge squares 1R(1) to 1R(9) in advance as numerical data and store the data as application quantity data showing an appropriate quantity of resin applied to each square.

Figure 7:
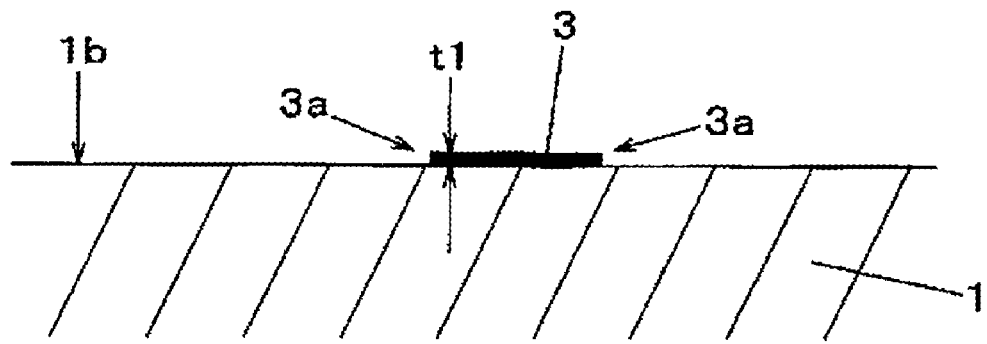
FIG. 7 is an enlarged cross sectional view of the semiconductor wafer that is to be an object of the substrate processing method of the first embodiment of the present invention.

After the print step, the semiconductor wafer 1 is sent to the baking step, where the wafer is heated to a temperature of the order of 40 degrees centigrade to 50 degrees centigrade, whereby the lyophobic films 3 whose lyophobic agent has adhered to the rear surface 1b are formed. As shown in FIG. 7, a thickness t1 of the lyophobic films 3 comes to 0.1 micrometers to 2 micrometers. When processing pertaining to the baking step is performed in a vacuum, a baking temperature can be reduced, so that occurrence of an increase in print width "b" can be prevented. If the solvent component evaporates during the print step, there will be no need to perform processing pertaining to the baking step.

The semiconductor wafer 1 on which the lyophobic pattern has been formed as mentioned above comes to an objective of application of a liquid resin for mask formation. As mentioned previously, the resin is applied in two steps; namely, the low viscosity resin (the second liquid) exhibiting superior wettability is previously applied in order to assure an appropriate spread of a high viscosity resin within the areas surrounded by the lyophobic films 3 before applying the high viscosity resin (the first liquid) including a resin, which is to make up a mask, in a solvent in a high concentration.

Any of hydrocarbon resins, which are not eliminated by plasma etching performed for the purpose of eliminating silicon—a material of the semiconductor wafer 1—and which can be easily removed by plasma ashing intended for removing a mask later, is used for the resin (resist) included in the first liquid that is the high viscosity resin. A liquid solution made by dissolving the resin in a saturated-hydrocarbon-based solvent is used as the first liquid. A composition of the first liquid is set such that a resin serving as solute assumes 40 to 80 percent content and that a solvent assumes 60 to 20 percent content. It is preferable to set the resin content so as to fall within a range from 40 to 50 percents.

The second liquid is set such that a resin (identical with the resin included in the first liquid) serving as solute assumes 0 to 40 percent content and that a solvent assumes 100 to 70 percent content. It is preferable to set the resin content so as to fall within a range from 10 to 20 percents. A purpose of application of the second liquid is to spread the second liquid in a wet fashion over the rear surface 1b in order to assure an appropriate spread of the high viscosity resin that is the first liquid to be applied later. Therefore, the second liquid does not always need to include a resin as solute. As indicated by the composition mentioned above, the first liquid may also be formed from 0 percent solute content and 100 percent solvent content.

When the second liquid includes a resin, the second liquid is a low concentration, low viscosity resin including a resin content that is lower than that of the first liquid. When the second liquid does not include a resin, the second liquid is made of only a solvent. In any case, the second liquid is lower than the first liquid in terms of viscosity. The second liquid exhibits superior wettability required to assure an appropriate spread of the first liquid to be applied later.

Specifically, under the substrate processing method described in connection with the embodiment, two types of liquids are prepared; namely, the first liquid including at least a solvent and a resin, and the second liquid whose viscosity is lower than that of the first liquid. Example configurations for making the viscosity of the second liquid lower than the viscosity of the first liquid include a first configuration for making the second liquid from solely a solvent and a second configuration for making the concentration of the resin included in the second liquid lower than the concentration of the resin included in the first liquid. In the first and second configurations, the second liquid includes the same solvent as that of the first liquid. In the second configuration, the second liquid includes the same resin as that of the first liquid, and the concentration of the resin included in the second liquid is lower than the concentration of the resin included in the first liquid.

For convenience's sake, a single type of solvent is used for the first liquid and the second liquid. However, the solvent of the first liquid does not always need to be identical with the solvent of the second liquid. A solvent of another type can also be used for the second liquid, so long as the solvent has a property of being dissolved in the first liquid. Likewise, example configurations for making the viscosity of the second liquid lower than the viscosity of the first liquid include a third configuration for forming the second liquid from solely a solvent and a fourth configuration for making the concentration of the resin included in the second liquid lower than the concentration of the resin included in the first liquid. In the third and fourth configurations, the solvent of the second liquid differs in type from the solvent of the first liquid, and the solvent has a property of being dissolved in the first liquid. In the fourth configuration, the resin included in the second liquid is identical with the resin included in the first liquid. The concentration of the resin included in the second liquid is lower than the concentration of the resin included in the first liquid.

The thus-prepared first and second liquids are supplied, in sequence of the second liquid and the first liquid, to the semiconductor wafer 1 on which the lyophobic pattern has been formed. An explanation is now given to a case where a low viscosity resin including a resin in a low concentration is used as the second liquid. First, as shown in FIG. 1, the low viscosity resin is applied (ST2). Specifically, as shown in FIG. 2(b), a low viscosity resin 4a (the second liquid) for the purpose of mask formation is supplied to the rear surface 1b that is the processing target surface of the semiconductor wafer 1 on which the lyophobic pattern is formed from the lyophobic films 3.

Figure 8:
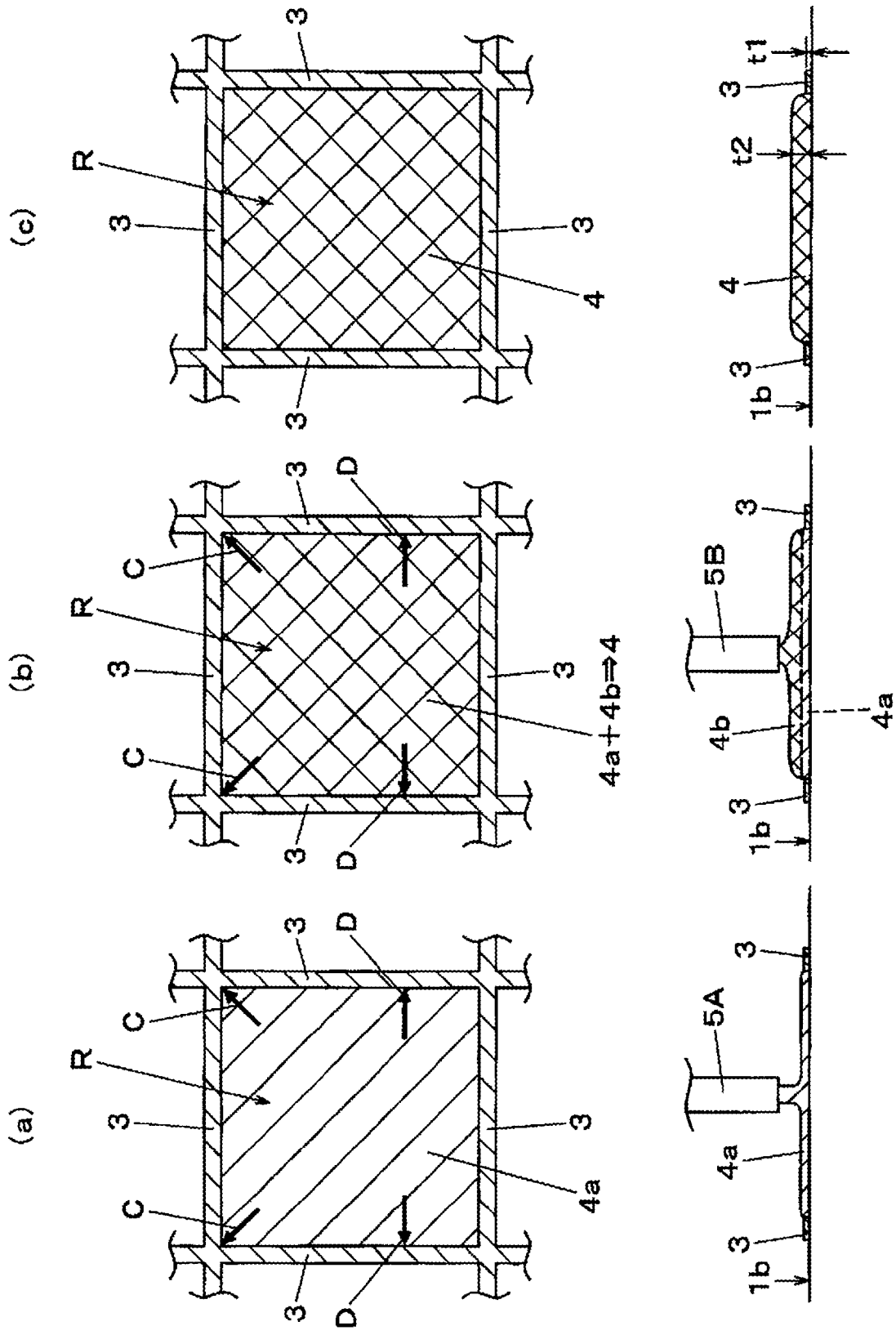
FIGS. 8 (a) to (c) are explanatory views of resin coating performed for making a mask under the substrate processing method of the first embodiment of the present invention.

FIG. 8(a) shows a state in which a dispense nozzle 5A applies the low viscosity resin 4a. As mentioned previously, the low viscosity resin 4a squirted from the dispense nozzle 5A to a center position in an area R surrounded by the lyophobic films 3 on the rear surface 1b spreads in a wet fashion toward a periphery within the area R along the rear surface 1b. The low viscosity resin 4a spread in a wet fashion is repelled by surfaces of the lyophobic films 3 exhibiting a lyophobic property, to thus adhere to only the area devoid of the lyophobic films 3. At this time, the low viscosity resin 4a has low viscosity and exhibits superior wettability and, hence, reliably advances to positions adjacent to borders D between the lyophobic films 3 formed in a grid shape and the area R. Further, the low viscosity resin 4a also advances to indentations of corners C where the lyophobic films 3 cross each other without causing gaps.

The high viscosity resin is now applied (ST3). As shown in FIG. 2(c), in addition to the low viscosity resin 4a, a high viscosity resin 4b (the first liquid) including a resin for mask formation in a high concentration is applied to the rear surface 1b of the semiconductor wafer 1 over which the low viscosity resin 4a has already been applied. Specifically, as shown in FIG. 8(b), a dispense nozzle 5B squirts the high viscosity resin 4b to the center of the area R on the rear surface 1b that is surrounded by the lyophobic films 3 and where the low viscosity resin 4a has already been applied. At this time, since a coating film of the low viscosity resin 4a that is to be dissolved in the high viscosity resin 4b has already been formed over the entirety of the area R, the squirted high viscosity resin 4b spreads toward the periphery within the area R while being dissolved in the low viscosity resin 4a and also guided by the low viscosity resin 4a. During the course of spread of the high viscosity resin 4b, the concentration of the resin in the low viscosity resin 4a and the concentration of the resin in the high viscosity resin 4b become uniform.

The low viscosity resin 4a and the high viscosity resin 4b are thereby mixed together, whereby a resin film 4 having a uniform concentration of resin is produced. The resin film 4 is at this time repelled by the surface of the lyophobic films 3 exhibiting a lyophobic property, thereby adhering to only areas devoid of the lyophobic films 3 and advancing to positions where the films become close to the borders D. Further, the resin film enters the indentations of the corners C without causing gaps. As shown in FIG. 8(c), the resin film 4 having a thickness t2 (see FIG. 10) that is larger than the thickness t1 of the lyophobic films 3 (see FIG. 7) is formed in the area R surrounded by the lyophobic films 3. It is preferable that a composition of the resin film 4 achieved when the low viscosity resin 4a and the high viscosity resin 4b are completely mixed together should include 30% or more and, desirably, about 40% of a resin serving as solute. By adoption of such a resin content, the rein film 4 holds itself on the rear surface 1b within the area R surrounded by the lyophobic films 3 in the course of the resin film 4 being heated, to thus evaporate the solvent. Therefore, the resin film 4 can sustain its shape in an applied state without causing contraction of a two-dimensional shape.

Specifically, in the steps (ST2) and (ST3) where the previously prepared low viscosity resin 4a serving as the first liquid and the high viscosity resin 4b serving as the second liquid are supplied to the rear surface 1b, which is the processing target surface of the semiconductor wafer 1 on which the lyophobic pattern is formed, in sequence of the high viscosity resin 4b serving as the second liquid and the low viscosity resin 4a serving as the first liquid. The resin film 4 whose thickness is larger than that of the lyophobic pattern is thereby formed in the area R that is surrounded by the lyophobic films 3 and where the lyophobic pattern is not formed (a resin film formation step).

Since the lyophobic film 3e having the same lyophobic property as that of the lyophobic films 3 is formed along the contour of the semiconductor wafer 1 set along the outer edge of the semiconductor wafer 1 to a predetermined width, on the occasion of application of the low viscosity resin 4a and the high viscosity resin 4b, the low viscosity resin 4a and the high viscosity resin 4b squirted from the respective dispense nozzles 5A and 5B to the contour of the semiconductor wafer 1 are repelled by the lyophobic film 3e. Therefore, it is possible to prevent the low viscosity resin 4a and the high viscosity resin 4b from hanging and falling from the outer edge of the semiconductor wafer 1, which would otherwise occur when the lyophobic film 3e is not present, and also prevent staining of the wafer table, which would otherwise be cause by a drop of the resin.

In relation to application of the low viscosity resin 4a from the dispense nozzle 5A and application of the high viscosity resin 4b from the dispense nozzle 5B, a quantity of resin squirted from the dispense nozzle 5A and a quantity of resin squirted from the dispense nozzle 5B may also be controlled according to the area of the square surrounded by the lyophobic films 3. Specifically, as has been described by reference to FIG. 5, the quantity of resin squirted from the dispense nozzle 5A and the quantity of resin squired from the dispense nozzle 5B are controlled according to application quantity data that specify for each square an appropriate quantity of resin applied, in association with the area [A] of the semiconductor chip 1e and the areas [A1] to [A9] of the outer edge squares 1R(1) to 1R(9). A proportion of the quantity of the low viscosity resin 4a applied to the quantity of the high viscosity resin 4b applied is set for each square in such a way that the quantity of the high viscosity resin 4b applied falls within a range from two to five, provided that the quantity of the low viscosity resin 4a applied is taken as one.

Figure 9:
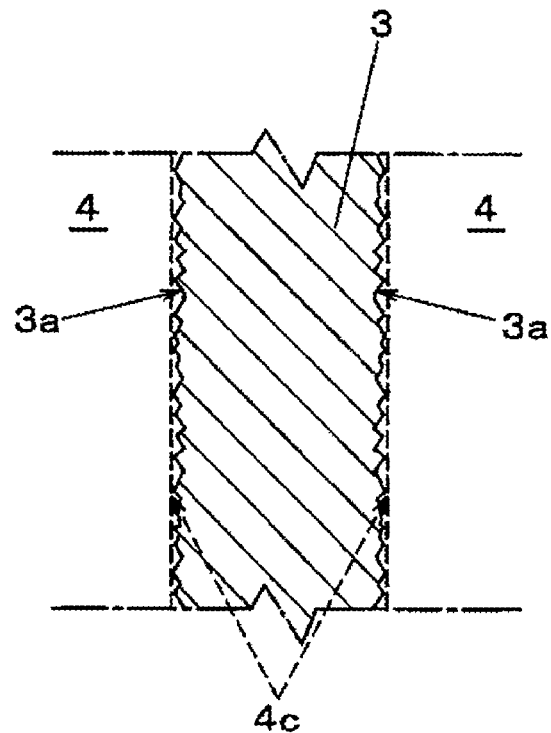
FIG. 9 is an enlarged view showing a liquid resin and the lyophobic pattern employed in the substrate processing method of the first embodiment of the present invention.

FIG. 9 shows, in an enlarged manner, a state of a contact between the lyophobic films 3 and the resin film 4 achieved after the resin film formation step. Although the edges 3a on both widthwise edges of each of the lyophobic films 3 assume a minute wavelike shape (a saw-toothed shape), a contour 4c of the resin film 4 (illustrated by broken lines in FIG. 9) remaining in contact with the edges 3a forms a substantially-linear, smooth line. The reason for this is that the resin film 4 exhibits surface tension in a liquid state and also a property of being impervious to following minute irregularities of the respective edges 3a because of action of surface tension. The property is very advantageous in view of formation of a mask having smooth edges. When the resin film 4 having the smooth contour 4c is treated in the subsequent baking step, a mask having edges (smooth edges) corresponding to the contour 4c is formed.

Subsequently, the thus-applied resin is dried (ST4). The semiconductor wafer 1 on which the resin film 4 is formed is again sent to the baking step, where the semiconductor wafer 1 is heated to a temperature ranging from 40 degrees centigrade to 70 degrees centigrade. As shown in FIG. 2(d), the solvent of the resin film 4 is vaporized, thereby forming, on the rear surface 1b that is the processing target surface (a mask formation step), a mask 4* that covers an area of the semiconductor wafer 1 except for the area (the area of the lyophobic films 3 set along the scribe lines 1c) to be etched away by plasma processing (the mask formation step).

Figure 10:
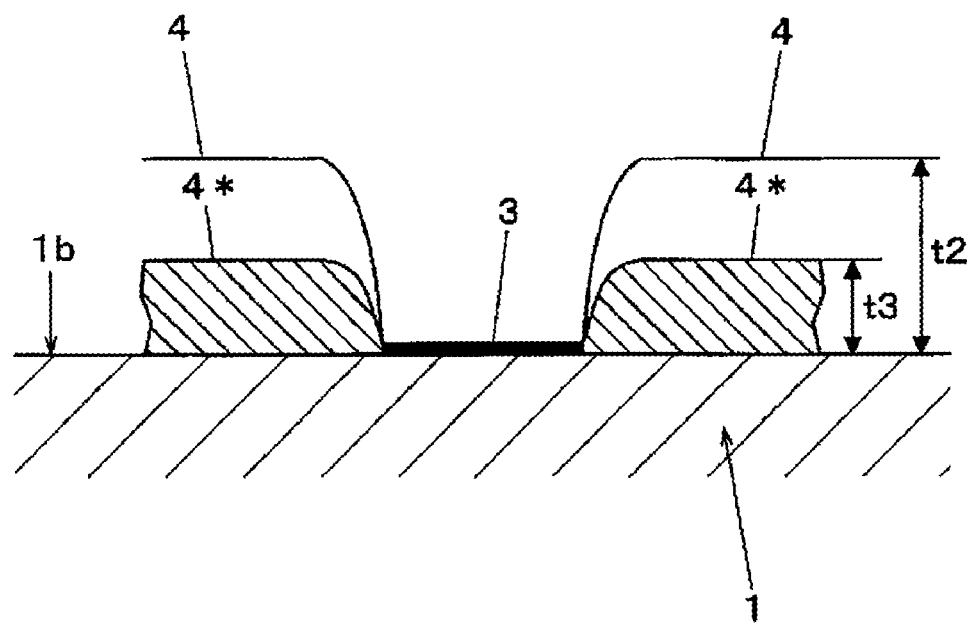
FIG. 10 is a cross sectional view of a resin layer and a mask of the substrate processing method of the first embodiment of the present invention.

FIG. 10 is a cross sectional view of the resin film and the mask. During the mask formation step, the solvent evaporates from the resin film 4, and a thickness t3 of the mask therefore becomes smaller than the thickness t2 of the resin film. For this reason, the thickness t3 of the mask is adjusted by adjustment of the thickness t2 of the resin film 4; namely, setting the resin content in the low viscosity resin 4a and the resin content in the high viscosity resin 4b and controlling the quantity of the low viscosity resin 4a applied and the quantity of the high viscosity resin 4b applied. The required thickness t3 of the mask is determined in consideration of etch resistance and an ashing time. In the present embodiment, a preferred value of the thickness t3 ranges from 5 micrometers to 20 micrometers. A relationship (a contraction factor) between the thickness t2 and the thickness t3 can be determined by a test, or the like. Accordingly, the thickness t2 of the resin film 4 required to obtain the required thickness t3 of the mask is determined from the contraction factor and the thickness t3. When the thickness t2 is determined, the resin content of the low viscosity resin 4a, the quantity of low viscosity resin 4a applied, the resin content of the high viscosity resin 4b, and the quantity of high viscosity resin 4b applied, all of which are required to achieve the thickness t2, can be determined by calculation.

After the mask formation step, the lyophobic pattern is removed as shown in FIG. 2(e) (ST5). Specifically, there is performed processing for dissolving the lyophobic pattern formed from the lyophobic films 3 by means of a solvent, to thus eliminate the lyophobic pattern from the rear surface 1*b* that is the processing target surface (a lyophobic pattern removal step). Processing is performed by supplying a solvent, such as ketones, polyalcohols, cyclic ethers, lactones, and esters, to the rear surface 1*b* on which the mask has already been formed, thereby dissolving the resin component of the lyophobic films 3 and eliminating the thus-dissolved films along with the solvent. A solvent that differs little from the substance used for the lyophobic films 3 in terms of an SP value is chosen as the solvent to be used this time. Dipping, spin etching, spraying, or the like, can be used as a method for supplying the solvent to the rear surface 1*b*, to thus remove the lyophobic films 3.

Processing pertaining to the lyophobic pattern removal step can also be performed by means of plasma etching using an oxygen gas plasma. Specifically, the semiconductor wafer 1 having undergone processing pertaining to the mask formation step is exposed in such a way that the rear surface 1*b* is irradiated with the oxygen gas plasma. The lyophobic films 3 and the mask 4*, which each are organic substances, are incinerated by ashing action of the oxygen gas plasma, to thus be removed. However, the thickness t3 of the mask 4* is sufficiently larger than the thickness t1 of the lyophobic films 3. Therefore, even after the lyophobic films 3 have been removed by ashing, the mask 4* still remains in a sufficient thickness on the rear surface 1*b*. Thus, the mask 4* can fulfill its function as a mask for etching using plasma.

After the lyophobic pattern removal step, the semiconductor wafer 1 that is a substrate is subjected to plasma etching (ST6). Specifically, the semiconductor wafer 1 is etched for dicing by means of plasma processing from the rear surface 1*b* that is the processing target surface of the semiconductor wafer 1, until the protective sheet 2 becomes uncovered (an etching step). The semiconductor wafer 1 is sent to a plasma processing apparatus, where the rear surface 1*b* of the semiconductor wafer 1 is irradiated with a fluorine-based gas plasma P, such as SF6, (FIG. 2(*f*)). A portion of the rear surface 1*b* of the semiconductor wafer 1, which is not covered with the mask 4* and exposed to the plasma P, is removed by etching action of the plasma P, whereby an etching trench 1*d* is formed. As a result of the etching trench 1*d* penetrating through an entire thickness of the semiconductor wafer 1, whereupon the semiconductor wafer 1 is separated into discrete semiconductor chips 1*e* as shown in FIG. 2(*f*).

During etching using the plasma P, the mask 4* having smooth edges is formed. Consequently, a diced edge of each of the separated discrete semiconductor chips 1*e* achieves a smooth, irregularity-free cut surface. Therefore,
it is possible to prevent occurrence of a defect that would deteriorate reliability of a semiconductor chip; in other words, a problem that is likely to arise when a cut surface has a rough shape, or minute cracks attributable to concentration of stress on minute irregularities.

The mask 4* is then removed (ST7). The semiconductor wafer 1 having finished undergoing processing pertaining to the etching step is subjected to processing for removing the mask 4* from the rear surface 1*b* that is the target processing surface (a mask removal step). Mask removal is performed by means of ashing for incinerating and removing the resin film 4 including a hydrocarbon-based resin as a component by use of an oxygen gas plasma. As a matter of course, a method for mechanically exfoliating the mask 4* from the rear surface 1*b* or a wet mask removal method using a chemical can also be used during mask removal. The semiconductor wafer 1 thereby enters a state in which the discrete semiconductor chips 1*e* are individually affixed to the protective sheet 2 as shown in FIG. 2(*g*).

Subsequently, a die-bonding sheet 11 is affixed to the surface from which the mask 4* has already been removed (ST8). As shown in FIG. 3(*a*), the semiconductor wafer 1 from which the mask has already been removed; namely, the plurality of semiconductor chips 1*e* that each have the circuit fabrication surfaces 1*a* adhesively held by the protective sheet 2, is transferred while the respective rear surfaces 1*b* of the respective semiconductor chips 1*e* are affixed to the die-bonding sheet 11. The die-bonding sheet 11 is stretched to an annular wafer ring 12*a*, to thus make up a wafer jig 12.

The protective sheet 2 is now removed (ST9). Specifically, the protective sheet 2 is peeled off from the semiconductor chips 1*e* affixed to the die-bonding sheet 11. As shown in FIG. 3(*b*), the discrete semiconductor chips 1*e* exposed with their circuit fabrication surfaces 1*e* oriented upward are held, through the respective rear surfaces 1*b*, by the die-bonding sheet 11, thereby completing a semiconductor chip aggregate 10. The semiconductor chip aggregate 10 is sent in this state to a die bonder. As shown in FIG. 3(*c*), the wafer ring 12*a* is held by a wafer hold mechanism 13 of the die bonder, whereby the discrete semiconductor chip 1*e* enters a state in which the chip can be picked up.

On the occasion of the picking-up of the semiconductor chip 1*e*, a bonding tool 14 and an ejector 15 are positioned to the semiconductor chip 1*e* that is to be picked up. An ejector pin 16 provided on the ejector 15 pushes the semiconductor chip 1*e* to be taken out from below, and the bonding tool 14 picks up and holds the semiconductor chip 1*e*. The bonding tool 14 has built-in heating means, and the semiconductor chip 1*e* is heated to a predetermined temperature as a result of being held by the bonding tool 14.

The bonding tool 14 that holds the thus-picked-up semiconductor chip 1*e* travels to a position above a heating support 17 that holds a substrate 18 to be bonded. A die-bonding adhesive 19 is applied over the substrate 18 in advance, and the substrate 18 is also heated in advance to a predetermined temperature by a heating mechanism (omitted from the drawings) provided in the heating support 17. The semiconductor chip 1*e* is aligned to a bonding position, and the bonding tool 14 is lowered, thereby placing the semiconductor chip 1*e* on an upper surface of the substrate 18 by way of the adhesive 19. Next, the bonding tool 14 presses the semiconductor chip 1*e* against the substrate 18 under predetermined applied pressure. Thermosetting reaction of the adhesive 19 proceeds as a result of the substrate being held in this state for a predetermined period of time. The semiconductor chip 1*e* is bonded to the substrate 18 by means of the thermosetting adhesive 19.

As mentioned above, in the plasma dicing described in connection with the first embodiment, the following method is employed during mask formation implemented by etching using plasma processing. Namely, the method includes printing the lyophobic liquid on an area to be etched, thereby forming the lyophobic pattern from the lyophobic films 3; preparing two types of liquids; namely, the first liquid including at least a solvent and a resin, and the second liquid whose viscosity is lower than that of the first liquid; supplying the liquids, in descending sequence of the second liquid and the first liquid, to the processing target surface of the substrate over which the lyophobic pattern is already formed, thereby forming the resin film 4 that is thicker than the lyophobic pattern on the area where the lyophobic pattern is not formed; and processing the semiconductor wafer over which the resin film 4 is formed in the baking step, thereby forming the mask 4* that covers an area of the semiconductor wafer except the area to be etched.

The lyophobic pattern produced under the foregoing method does not need a high degree of positional accuracy and shape accuracy. Therefore, the mask can be formed at low cost by means of the existing technique using simple, inexpensive facilities. Therefore, a mask for use in etching using plasma processing can be formed at low cost without use of a high-cost method, like photolithography and laser irradiation.

There is employed the method for applying two types of liquids; namely, the first liquid including a solvent and a resin and the second liquid whose viscosity is lower than that of the first viscosity, in predetermined sequence, to thus form the resin film 4 for mask formation. As a result, it is possible to effectively prevent occurrence of the following problems, which would otherwise be likely to arise during formation of a mask using a lyophobic pattern. Specifically, when a high viscosity liquid resin is used, wet-spreading of the resin is hindered by surface tension of the resin, thereby posing difficulty in letting the resin enter the corners of the lyophobic pattern without casing gaps. Thus, it is difficult to form a mask assuming an appropriate shape. When a low viscosity liquid resin is used, superior wettability is achieved in an applied state, and uniform application of the resin is possible. However, occurrence of contractive deformation of a resin film, which would otherwise be caused by evaporation of the solvent in the baking step subsequent to resin application, is unavoidable, thereby likewise posing difficulty in forming a mask having an appropriate shape.

On the contrary, there is adopted the method for using two types of liquids and first supplying the second liquid and the first liquid. As a result, the second liquid can be uniformly spread in a wet fashion within an area surrounded by the lyophobic pattern. Next, the first liquid, or the high viscosity resin, is supplied, whereby the first liquid can be well spread in a wet fashion while being guided in the second liquid that has already been applied. Therefore, the problem is dissolved, and the resin film 4 for mask formation can be formed in a superior shape.

Second Embodiment

A second embodiment of the present invention relates to a semiconductor chip manufacturing method utilizing an application of the substrate processing method described in connection with the first embodiment. A resin adhesive layer used when the discrete semiconductor chips formed by separating the semiconductor chips are bonded is caused to act as a mask required during etching operation using plasma processing for separating the semiconductor wafer. In FIGS. 12 through 15, elements having configurations similar to those of their counterparts described in connection with the first embodiment are assigned the same reference numerals, and different reference numerals are assigned to solely element having different configurations, to thus be distinguished.

First, a lyophobic pattern and a resin adhesive layer of the present embodiment are described. In the present embodiment, a lyophobic pattern is formed from a resin (a lyophobic agent) that exhibits a lyophobic property against a solvent included in a liquid resin which is to act as a material for making up a resin adhesive layer. Specifically, the lyophobic pattern is formed, in advance, from a lyophobic agent in an area except for an area on the semiconductor wafer where the resin adhesive layer is formed. The liquid resin making up the resin adhesive layer is caused to adhere to solely the area where the resin adhesive layer is to be formed. On the occasion of formation of the lyophobic pattern, a liquid (a lyophobic liquid) made by dissolving a lyophobic agent in a solvent is printed in a predetermined pattern by means of transfer printing, screen printing, dispensing, inkjet printing, or the like. A solvent component is volatized after printing, whereupon the lyophobic pattern is completed.

Thermosetting resins, such as epoxy-based resins, are used as a resin making up a resin adhesive layer. On the occasion of formation of a resin adhesive layer, a liquid resin made by dissolving a thermosetting resin in a solvent is applied over the processing target surface of the substrate over which the lyophobic pattern is formed, by means of a method, like dispensing, inkjet printing, and spin-coating. Since the solvent of the liquid resin applied over the processing target surface is repelled by the lyophobic agent, the liquid resin spreads over only an area of the processing target surface except for the lyophobic pattern. The substrate over which the liquid resin is applied is heated, thereby vaporizing the solvent. Further, the thermosetting resin is semi-cured, whereby a resin adhesive layer patterned by the lyophobic pattern is produced.

In the present invention adopting such a resin adhesive layer formation method, the lyophobic agent used for the lyophobic pattern must correspond to a combination of lyophobic agents that exhibit a lyophobic property against the solvent included in the liquid resin used for forming a resin adhesive layer. In addition, a solvent that is dissolved in a thermosetting resin must be chosen. Accordingly, when a resin to be used is any of epoxy-based thermosetting resins (having an SP value of 10.9), any of alcohol-based solvents having an SP value ranging from 10.0 to 11.9 is chosen as a solvent. Acrylic resins (having an SP value of 9.2), silicone-based resins (having an SP value of 7.0), and fluorine-based resins (having an SP value of 3.6) can be used as a lyophobic agent in this case.

Even in the second embodiment, during the course of the resin adhesive layer being formed from liquid resins, two types of liquids having different viscosity levels are prepared, and the liquids are supplied in two steps in the same manner as in the first embodiment. Specifically, a low viscosity resin (the second liquid) whose viscosity is lower than a high viscosity resin is first supplied before supplying the high viscosity resin (the first liquid) including a resin component which is to make up the resin adhesive layer in a high concentration. The low viscosity resin is uniformly spread in a wet fashion within the area surrounded by the lyophobic pattern, and the high viscosity resin is then supplied, thereby assuring a quantity of resin component required to form a resin adhesive layer.

Figure 11:
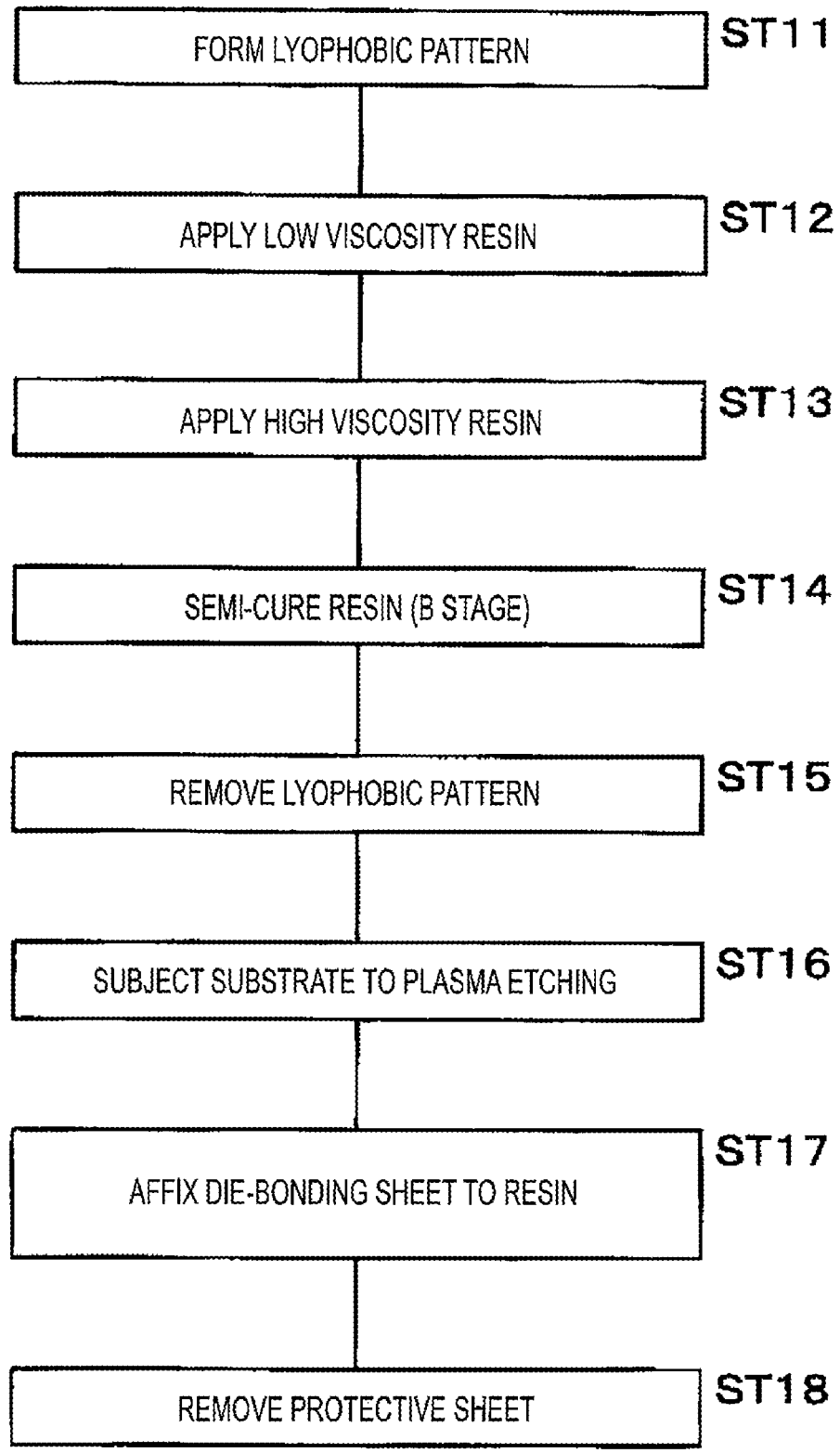
FIG. 11 is a flowchart showing a resin-adhesive-layer-backed semiconductor chip manufacturing method of a second embodiment of the present invention.
Figure 12:
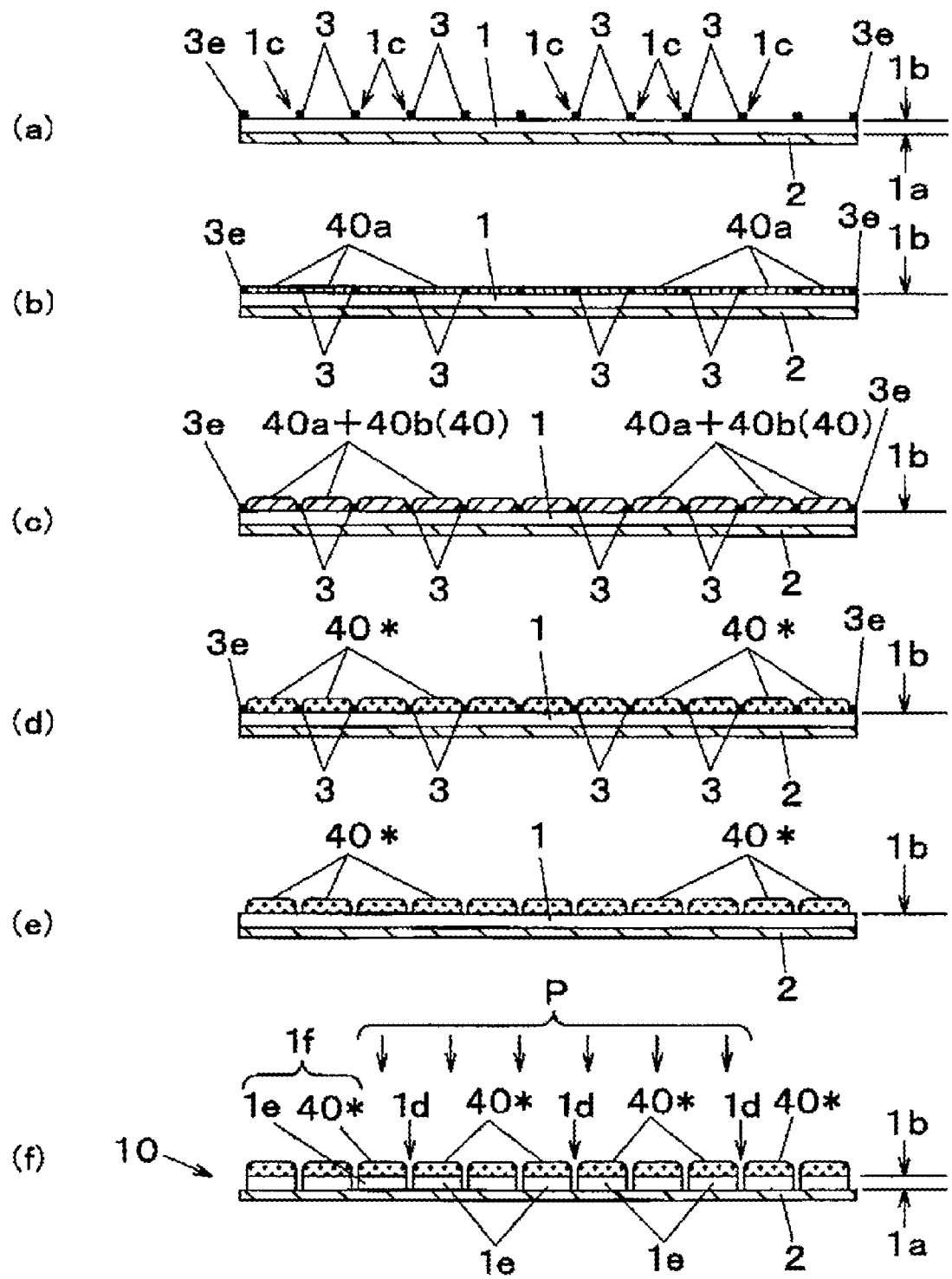
FIGS. 12 (a) to (f) are explanatory process charts of the resin-adhesive-layer-backed semiconductor chip manufacturing method and a method for bonding a semiconductor chip with a resin adhesive layer of the second embodiment of the present invention.
Figure 13:
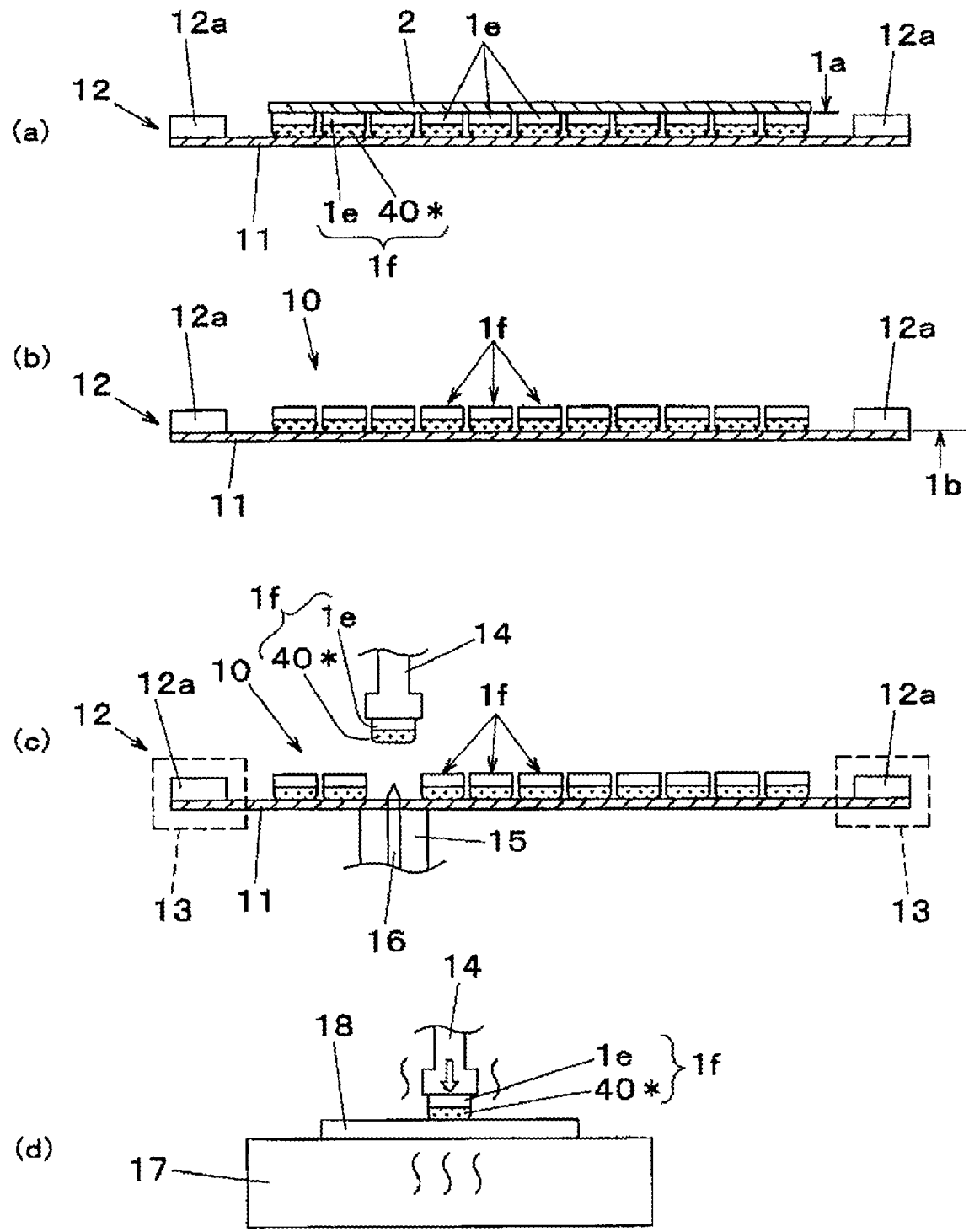
FIGS. 13 (a) to (d) are explanatory process charts of the resin-adhesive-layer-backed semiconductor chip manufacturing method and the method for bonding a semiconductor chip with a resin adhesive layer of the second embodiment of the present invention.

A resin-adhesive-layer-backed semiconductor chip manufacturing method is now described by reference to the drawings; namely, a flowchart of FIG. 11 and explanatory process charts of FIGS. 12 and 13. In FIG. 11, a lyophobic pattern is first made over the semiconductor wafer 1 serving as a substrate (ST11). As shown in FIG. 12(a), a plurality of semiconductor chips including integrated circuits (semiconductor devices) are fabricated on the semiconductor wafer 1. The protective sheet 2 for protecting the integrated circuits is affixed to the circuit fabrication surface 1a of the semiconductor wafer 1 where the integrated circuits are fabricated. The rear surface 1b that is the other side of the circuit fabrication surface 1a is made thin to a thickness of 100 micrometers or less by means of removing a surface layer in a thinning step, which is a preceding step, through performance of mechanical grinding.

Next, as shown in FIG. 12(b), a lyophobic pattern is formed, on the rear surface 1b (corresponding to the processing target surface of the substrate to be etched in the substrate), along the grid lines (corresponding to areas to be etched away) corresponding to the scribe lines 1c (see FIG. 4) that separate the semiconductor wafer 1 into the respective semiconductor chips 1e and along the contour [see FIG. 2(a) and the lyophobic film 3e shown in FIG. 5] set to a predetermined width along the outer edge of the semiconductor wafer 1 (the lyophobic pattern formation step). In addition to being formed along the grid lines corresponding to the scribe lines 1c (see FIG. 4), the lyophobic pattern is formed along the contour of the semiconductor wafer 1. The lyophobic pattern formed along the contour is intended to prevent the liquid resin from running over the outer edge of the semiconductor wafer 1 to thereby fall from the wafer, which would otherwise occur when the liquid resin is applied after formation of the lyophobic pattern. The lyophobic pattern formation step is analogous to that described in connection with the first embodiment, and hence its detailed explanation is omitted here for brevity.

The semiconductor wafer 1 on which the lyophobic pattern has been formed as mentioned above comes to an objective of application of a liquid resin for making a resin adhesive layer. As mentioned previously, the resin is applied in two steps; namely, the low viscosity resin (the second liquid) exhibiting superior wettability is applied in advance in order to assure an appropriate spread of the high viscosity resin within the areas surrounded by the lyophobic films 3 before applying the high viscosity resin (the first liquid) including a resin, which is to make up a mask, in a solvent in a high concentration.

Any of thermosetting resins, such as epoxy-based resins, is used for the resin to be included in the first liquid that is the high viscosity resin. A solution made by dissolving the thermosetting resin in an alcohol-based solvent is used as the first liquid. A composition of the first liquid is set such that a resin serving as solute assumes 40 to 80 percent content and that a solvent assumes 60 to 20 percent content. It is preferable to set the resin content so as to fall within a range from 40 to 50 percents.

The second liquid is also set such that a resin (identical with the resin included in the first liquid) serving as solute assumes 0 to 40 percent content and that a solvent assumes 100 to 70 percent content. It is preferable to set the resin content so as to fall within a range from 10 to 20 percents. A purpose of application of the second liquid is to spread the second liquid over the rear surface 1b in a wet fashion in order to assure an appropriate spread of the high viscosity resin that is the first liquid to be applied later. Therefore, the second liquid does not always need to include a resin as solute. As indicated by the composition mentioned above, the first liquid may also be formed from 0 percent solute content and 100 percent solvent content.

When the second liquid includes a resin, the second liquid is a low concentration, low viscosity resin including a resin content that is lower than that of the first liquid. When the second liquid does not include a resin, the second liquid is made of only a solvent. In any case, the second liquid is lower than the first liquid in terms of viscosity. The second liquid exhibits superior wettability required to assure an appropriate spread of the first liquid to be applied later.

Specifically, under the resin-adhesive-layer-backed semiconductor chip manufacturing method described in connection with the embodiment, two types of liquids are prepared; namely, the first liquid including at least a solvent and a resin, and the second liquid whose viscosity is lower than that of the first liquid. Example configurations for making the viscosity of the second liquid lower than the viscosity of the first liquid include the first configuration for making the second liquid from solely a solvent and the second configuration for making the concentration of the resin included in the second liquid lower than the concentration of the resin included in the first liquid. In the first and second configurations, the second liquid includes the same solvent as that of the first liquid. In the second configuration, the second liquid includes the same resin as that of the first liquid, and the concentration of the resin included in the second liquid is lower than the concentration of the resin included in the first liquid.

For convenience's sake, a single type of solvent is used for the first liquid and the second liquid. However, the solvent of the first liquid does not always need to be identical with the solvent of the second liquid. A solvent of another type can also be used for the second liquid, so long as the solvent has a property of being dissolved in the first liquid. Likewise, example configurations for making the viscosity of the second liquid lower than the viscosity of the first liquid include the third configuration for forming the second liquid from solely a solvent and the fourth configuration for making the concentration of the resin included in the second liquid lower than the concentration of the resin included in the first liquid. In the third and fourth configurations, the solvent of the second liquid differs in type from the solvent of the first liquid, and the solvent has a property of being dissolved in the first liquid. In the fourth configuration, the resin included in the second liquid is identical with the resin included in the first liquid. The concentration of the resin included in the second liquid is lower than the concentration of the resin included in the first liquid.

The thus-prepared first and second liquids are supplied, in sequence of the second liquid and the first liquid, to the semiconductor wafer 1 on which the lyophobic pattern has been formed. An explanation is now given to a case where a low viscosity resin including a resin in a low concentration is used as the second liquid. First, as shown in FIG. 11, the low viscosity resin is applied (ST12). Specifically, as shown in FIG. 12(b), a low viscosity resin 40a (the second liquid) for the purpose of mask formation is supplied to the rear surface 1b that is the processing target surface of the semiconductor wafer 1 on which the lyophobic pattern is formed from the lyophobic films 3. The high viscosity resin is now applied (ST13). As shown in FIG. 12(c), in addition to the low viscosity resin 40a, a high viscosity resin 40b (the first liquid) including a resin for mask formation in a high concentration is applied to the rear surface 1b of the semiconductor wafer 1 over which the low viscosity resin 40a has already been applied.

Specifically, in the steps (ST12) and (ST13) where the previously prepared low viscosity resin 40a serving as the first liquid and the high viscosity resin 40b serving as the second liquid are supplied to the rear surface 1b, which is the processing target surface of the semiconductor wafer 1 on which the lyophobic pattern is formed, in sequence of the high viscosity resin 40b serving as the second liquid and the low viscosity resin 40a serving as the first liquid. The resin film 40 whose thickness is larger than the thickness t1 of the lyophobic pattern is thereby formed in the area R that is surrounded by the lyophobic films 3 and where the lyophobic pattern is not formed (the resin film formation step). Details about application of the low viscosity resin 40a and the high viscosity resin 40b performed in (ST12) and (ST13) are the same as those described in connection with the low viscosity resin 4a and the high viscosity resin 4b in the first embodiment by reference to FIG. 8, and hence their explanations are omitted here for brevity.

The lyophobic film 3e having the same lyophobic property as that of the lyophobic films 3 is formed along the contour of the semiconductor wafer 1 set along the outer edge of the semiconductor wafer 1 to a predetermined width. Hence, on the occasion of application of the low viscosity resin 40a and the high viscosity resin 40b, the low viscosity resin 40a and the high viscosity resin 40b squirted from the respective dispense nozzles 5A and 5B to the contour of the semiconductor wafer 1 are repelled by the lyophobic film 3e. Consequently, it is possible to prevent the low viscosity resin 40a and the high viscosity resin 40b from hanging and falling from the outer edge of the semiconductor wafer 1, which would otherwise occur when the lyophobic film 3e is not present, and also prevent staining of the wafer table, which would otherwise be cause by a drop of the resin.

In relation to application of the low viscosity resin 40a from the dispense nozzle 5A and application of the high viscosity resin 40b from the dispense nozzle 5B, a quantity of resin squirted from the dispense nozzle 5A and a quantity of resin squirted from the dispense nozzle 5B may also be controlled according to the area of the square surrounded by the lyophobic films 3. Specifically, as has been described by reference to FIG. 5, the quantity of resin squirted from the dispense nozzle 5A and the quantity of resin squired from the dispense nozzle 5B are controlled according to application quantity data that specify for each square an appropriate quantity of resin applied, in association with the area [A] of the semiconductor chip 1e and the areas [A1] to [A9] of the outer edge squares 1R(1) to 1R(9). A proportion of the quantity of the low viscosity resin 40a applied to the quantity of the high viscosity resin 40b applied is set for each square in such a way that the quantity of the high viscosity resin 40b applied falls within a range from two to five, provided that the quantity of the low viscosity resin 40a applied is taken as one.

Figure 14:
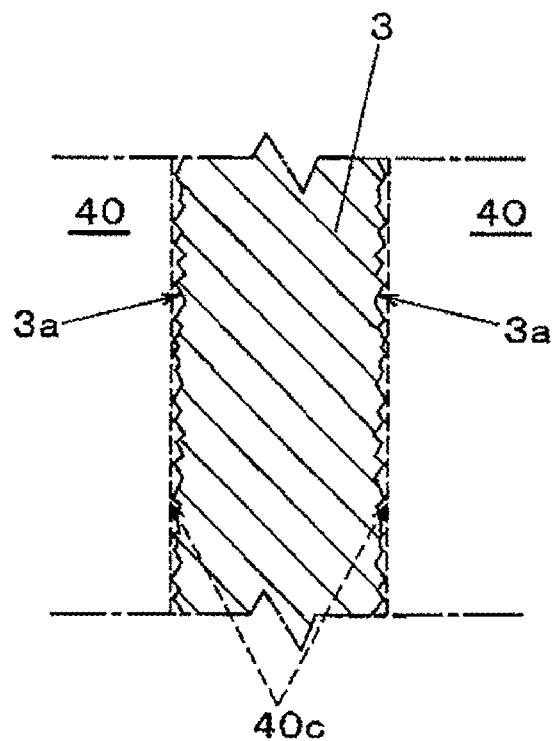
FIG. 14 is an enlarged view of a lyophobic pattern of the resin-adhesive-layer-backed semiconductor chip manufacturing method of the second embodiment of the present invention.

FIG. 14 shows, in an enlarged manner, a state of a contact between the lyophobic films 3 and the resin film 40 achieved after the resin film formation step. Although the edges 3a on both widthwise edges of each of the lyophobic films 3 assume a minute wavelike shape (a saw-toothed shape), a contour 40c of the resin film 40 (illustrated by broken lines in FIG. 14) remaining in contact with the edges 3a forms a substantially-linear, smooth line. The reason for this is that the resin film 40 exhibits surface tension in a liquid state and also a property of being impervious to following minute irregularities of the respective edges 3a because of action of surface tension. The property is very advantageous in view of formation of a mask having smooth edges. When the resin film 4 having the smooth contour 40c is treated in the subsequent baking step, a mask having edges (smooth edges) corresponding to the contour 40c is formed.

Subsequently, the thus-applied resin is semi-cured (ST14). The semiconductor wafer 1 on which the resin film 40 is formed is again sent to a curing step, where the semiconductor wafer 1 is heated to a temperature of about 90 degrees centigrade. The resin film 40 is thus-semi-cured in a state of B stage, whereby a resin adhesive layer 40* is formed as shown in FIG. 12(d) (a resin adhesive formation step). At this time, the resin adhesive layer 40* covers an area except for the area to be removed by means of etching using plasma processing (i.e., the area of the lyophobic films 3 set along the scribe lines 1c). Therefore, the resin adhesive layer 40* acts as a mask for etching using plasma processing. The thickness of the resin adhesive layer 40* is reduced from the shape of the adhesive layer achieved after application by an amount equal to the quantity of evaporated solvent.

Figure 15:
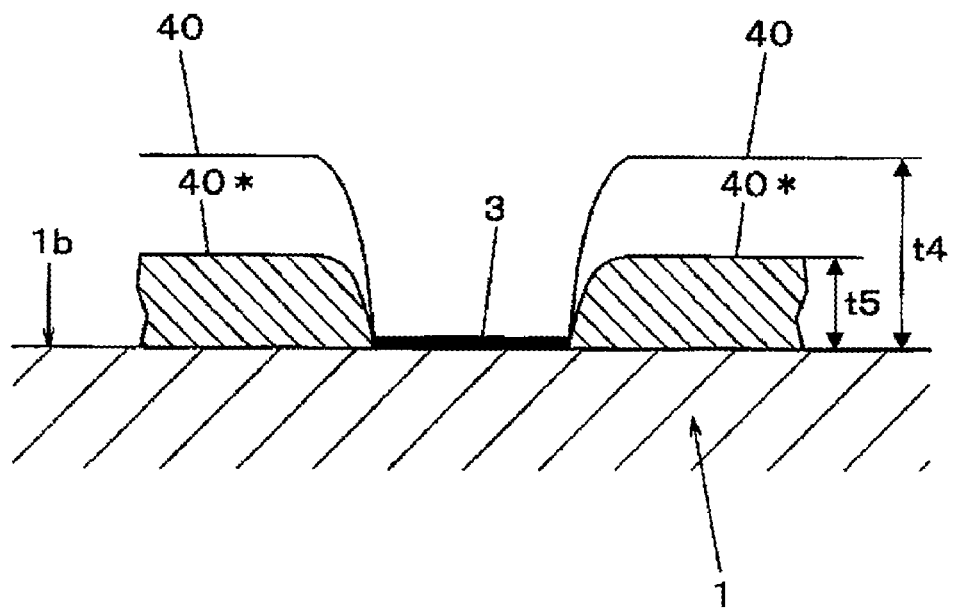
FIG. 15 is an enlarged cross sectional view of a semiconductor wafer that is to become an object of plasma dicing of the semiconductor chip with a second resin adhesive layer manufacturing method of the second embodiment of the present invention.

FIG. 15 is a cross sectional view of the resin film 40 and the resin adhesive layer 40*. Since the solvent evaporates from the resin film 40 in the resin adhesive layer formation step, a thickness t5 of the resin adhesive layer 40* becomes smaller than a thickness t4 of the resin film 40. Therefore, adjustment of the thickness t5 of the adhesive resin layer 40* is adjusted by adjustment of the thickness t4 of the resin film 40; namely, setting the resin content in the low viscosity resin 40a and the resin content in the high viscosity resin 40b and controlling the quantity of the low viscosity resin 40a applied and the quantity of the high viscosity resin 40b applied. The required thickness t5 of the resin adhesive layer 40* is determined from the thickness of the semiconductor chip 1e that is an objective of bonding, the thickness of the adhesive layer achieved after bonding, and the like.

In the present embodiment, a value of the thickness t5 is determined from the thickness of an adhesive layer to which the semiconductor chip 1e is to be die-bonded, and the value of the thickness t5 preferably ranges from 20 micrometers to 30 micrometers. A relationship (a contraction factor) between the thickness t4 and the thickness t5 can be determined by a test, or the like. Accordingly, the thickness t4 of the resin film 40 required to obtain the required thickness t5 of the resin adhesive resin layer 40* is determined from the contraction factor and the thickness t5. When the thickness t4 is determined, the resin content of the low viscosity resin 4a, the quantity of low viscosity resin 40a applied, the resin content of the high viscosity resin 40b, and the quantity of high viscosity resin 40b applied, all of which are required to achieve the thickness t4, can be determined by calculation.

After the resin adhesive layer formation step, the lyophobic pattern is removed as shown in FIG. 12(e) (ST15). Specifically, there is performed processing for dissolving the lyophobic pattern formed from the lyophobic films 3 by means of a solvent, to thus eliminate the lyophobic pattern from the rear surface 1b (the lyophobic pattern removal step). Processing is identical with processing pertaining to the lyophobic pattern removal step described in connection with the first embodiment, and hence its explanation is omitted here for brevity.

After the lyophobic pattern removal step, the semiconductor wafer 1 that is a substrate is subjected to plasma etching (ST16). Specifically, the semiconductor wafer 1 is etched for dicing by means of plasma processing from the rear surface 1b that is the processing target surface of the semiconductor wafer 1, until the protective sheet 2 becomes uncovered (the etching step). The semiconductor wafer 1 is sent to a plasma processing apparatus, where the rear surface 1b of the semiconductor wafer 1 is irradiated with a fluorine-based gas plasma P, such as SF6, (FIG. 12(f)). A portion of the rear surface 1b of the semiconductor wafer 1, which is not covered with the resin adhesive layer 40* serving as the mask and exposed to the plasma P, is removed by etching action of the plasma P, whereby the etching trench 1d is formed. As a result of the etching trench 1d penetrating through an entire thickness of the semiconductor wafer 1, whereupon the semiconductor wafer 1 is separated into discrete semiconductor chips 1e as shown in FIG. 12(f). After completion of processing pertaining to the etching step, the semiconductor wafer 1 to which there is affixed the protective sheet 2 for protecting the circuit fabrication surface 1a is separated into a plurality of semiconductor chips 1f, each of which has the resin adhesive layer 40* in the state of B stage placed on the rear surface 1b of the semiconductor chip 1e for use in die-bonding operation.

During etching using the plasma P, heat of the plasma P exerts on the resin adhesive layer 40*. As mentioned previously, the resin adhesive layer 40* is required to hold a semi-cured state of B stage. Hence, in the course of plasma processing, temperature conditions are required to be controlled such that a surface temperature of the resin adhesive layer 40* does not exceed a thermosetting temperature (100 degrees centigrade to 150 degrees centigrade) of a chosen epoxy-based resin. A method used for controlling the temperature conditions includes appropriately adjusting plasma processing conditions of a plasma processing apparatus used; for instance, appropriate adjustment of an output from a high frequency power unit, or controlling a temperature of the semiconductor wafer 1 by use of cooling means for circulating a cooling medium through an interior of electrodes where the semiconductor wafer 1 to be processed is placed, to thus prevent the temperature of the semiconductor wafer 1 from rising in excess of an appropriate range. A configuration for the plasma processing apparatus that circulates the cooling medium through the interior of the electrodes where a processing target is placed in order to prevent excessive heating of the processing target is a known technique (see; for instance, JP-A-2004-55703 and JP-A-2007-80912).

During plasma dicing, the adhesive resin layer 40* (a mask) having smooth edges is formed. Consequently, a diced edge of each of the separated discrete semiconductor chips 1e also achieves a smooth, irregularity-free cut surface. Therefore, it is possible to prevent occurrence of a defect that would deteriorate reliability of a semiconductor chip; in other words, a problem that is likely to arise when a cut surface has a rough shape, or minute cracks attributable to concentration of stress on minute irregularities.

Subsequently, the die-bonding sheet 11 is affixed to the resin adhesive layer 40* (ST17). As shown in FIG. 13(a), the plurality of semiconductor chips 1f with adhesive resin layers whose circuit fabrication surfaces 1a are held and affixed to the protective sheet 2 are transferred while the respective resin adhesive layers 40* are affixed to the die-bonding sheet 11. The die-bonding sheet 11 is stretched to the annular wafer ring 12a, to thus make up the wafer jig 12.

The protective sheet 2 is now removed (ST18). Specifically, the protective sheet 2 is peeled off from the semiconductor chip 1f with a resin adhesive layer affixed to the die-bonding sheet 11. As shown in FIG. 13(b), the semiconductor chip aggregate 10 is completed, wherein the plurality of semiconductor chips 1f with resin adhesive layers, whose circuit fabrication surfaces 1a are oriented upward and exposed, are held by the die-bonding sheet 11 from the respective rear surfaces 1b. The semiconductor chip aggregate 10 is sent in this state to a die bonder. As shown in FIG. 3(c), the wafer ring 12a is held by the wafer hold mechanism 13 of the die bonder, whereby the discrete semiconductor chip 1f enters a state in which the discrete semiconductor chip 1 with a resin adhesive layer can be picked up.

On the occasion of the picking-up of the semiconductor chip 1f with the resin adhesive layer, the die-bonding tool 14 and the ejector 15 are positioned to the semiconductor chip 1f with the resin adhesive layer that is to be picked up. The ejector pin 16 provided on the ejector 15 pushes the semiconductor chip 1f with the resin adhesive layer to be taken out from below, and the bonding tool 14 picks up and holds the semiconductor chip 1f with the resin adhesive layer. The bonding tool 14 has built-in heating means, and the semiconductor chip 1f with the resin adhesive layer is heated to a predetermined temperature as a result of being held by the bonding tool 14.

The bonding tool 14 that holds the thus-picked-up semiconductor chip 1f with the resin adhesive layer travels to a position above the heating support 17 that holds the substrate 18 to be bonded. The substrate 18 is also heated in advance to a predetermined temperature by a heating mechanism (omitted from the drawings) provided in the heating support 17. The semiconductor chip 1f with the resin adhesive layer is aligned to a bonding position, and the bonding tool 14 is lowered, thereby placing the semiconductor chip 1e on the upper surface of the substrate 18 by way of the resin adhesive layer 40*. Next, the bonding tool 14 presses the semiconductor chip 1e against the substrate 18 under predetermined applied pressure. Thermosetting reaction of the resin adhesive layer 40* proceeds as a result of the substrate being held in this state for a predetermined period of time. The semiconductor chip 1e is bonded to the substrate 18 by means of the resin adhesive layer 40*.

As mentioned above, in the second embodiment, during manufacture of semiconductor chips for separating the semiconductor wafer 1 into the semiconductor chips if with adhesive resin layers, which each are formed from semiconductor devices, by means of etching using plasma processing, there is employed a method including printing a lyophobic liquid on the rear surface 1b of the semiconductor wafer 1 that is the other side of the circuit fabrication surface 1a, along the scribe lines 1c that are borders between the semiconductor chips 1e, thereby forming a lyophobic pattern; preparing two types of liquids; namely, the first liquid including at least a solvent and a resin, and the second liquid whose viscosity is lower than that of the first liquid; supplying the liquids over the processing target surface of the semiconductor wafer 1 where the lyophobic pattern is formed, in descending sequence of the second liquid and the first liquid, thereby forming the resin film 40 that is thicker than the lyophobic pattern is formed on the area where the lyophobic pattern is not formed; semi-curing the resin film 40, to thus form the resin adhesive layer 40*; and etching, after removal of the lyophobic pattern from the rear surface of the semiconductor wafer, the rear surface 1b of the semiconductor wafer 1 while the resin adhesive layer 40* is taken as a mask. As a result, a mask for etching using plasma processing is formed at low cost, and the mask can also be used as the resin adhesive layer 40* for die-bonding. Further, the advantage yielded when the two types of liquids are prepared and applied in two steps as mentioned in connection with the resin film formation step is also the same as that yielded in the first embodiment.

In the first and second embodiments, processing for separating the semiconductor wafer serving as the substrate into discrete semiconductor chips by means of plasma dicing has been described as an example objective of the invention. However, the present invention is not limited to the processing. The present invention can be applied to processing of any form, so long as processing is intended for a substrate and requires formation of a mask in association with etching using plasma processing. For instance, the present invention can be applied to various types of processing intended for a substrate; for instance, an example application for boring via holes in a semiconductor substrate by means of etching using a plasma, an example application for forming a minute mechanical device by application of a semiconductor processing technique and through use of etching using a plasma in a course of manufacture of an MEMS (Microelectromechanical System); an example application for forming a circuit pattern on a transparent display panel; and the like.

The present patent application is based on Japanese Patent Application (JP-2009-095800) filed on Apr. 10, 2009, the entire subject matter of which is incorporated herein by reference.

INDUSTRIAL APPLICABILITY

The substrate processing method and the semiconductor chip manufacturing method of the present invention are characterized in that a mask for use in etching using a plasma can be formed at low cost. The methods are useful for processing various substrates, such as processing for separating a semiconductor wafer serving as a substrate into discrete semiconductor chips, by means of plasma dicing.

DESCRIPTIONS OF THE REFERENCE NUMERALS AND SYMBOLS

1 SEMICONDUCTOR WAFER
1a CIRCUIT FABRICATION SURFACE
1b REAR SURFACE (PROCESSING TARGET SURFACE)
1c SCRIBE LINE
1e SEMICONDUCTOR CHIP
2 PROTECTIVE SHEET
3, 3e LYOPHOBIC FILM
4 RESIN FILM
4a LOW VISCOSITY RESIN (SECOND LIQUID)
4b HIGH VISCOSITY RESIN (FIRST LIQUID)
4* MASK
40 RESIN FILM
40a LOW VISCOSITY RESIN (SECOND LIQUID)
40b HIGH VISCOSITY RESIN (FIRST LIQUID)
40* RESIN ADHESIVE LAYER
P PLASMA

The invention claimed is:

1. A substrate processing method for partially eliminating a substrate by etching using plasma processing, the method comprising:
   a lyophobic pattern formation step of printing a lyophobic liquid to an area to be etched away on a processing target surface of the substrate, thereby forming a lyophobic pattern;
   a resin film formation step of preparing a first liquid including at least a solvent and a resin and a second liquid whose viscosity is lower than a viscosity of the first liquid and supplying the liquids in descending sequence of the second liquid and the first liquid on the processing target surface of a substrate on which the lyophobic pattern is formed, thereby forming a resin film that is thicker than the lyophobic pattern in an area where the lyophobic pattern is not formed;
   a mask formation step of curing the resin film, to thus form on the processing target surface a mask for covering an area except for the area to be etched away;
   a lyophobic pattern removal step of removing the lyophobic pattern from the processing target surface after performance of processing pertaining to the mask formation step;
   an etching step of etching the substrate from the processing target surface thereof using plasma processing after processing pertaining to the lyophobic pattern removal step; and
   a mask removal step of removing the mask from the processing target surface after completion of processing pertaining to the etching step.

2. The substrate processing method according to claim 1, wherein the second liquid includes the same solvent as that of the first liquid.

3. The substrate processing method according to claim 2, wherein the second liquid includes the same resin as that of the first liquid, and the resin in the second liquid is lower in concentration than the resin in the first liquid.

4. The substrate processing method according to claim 1, wherein the second liquid includes a liquid that differs in type from a solvent of the first liquid and that exhibits a property of being dissolved in the first liquid.

5. A semiconductor chip manufacturing method for separating a semiconductor wafer, which has a plurality of semiconductor devices on a circuit fabrication surface and which is affixed with a protective sheet for protecting the circuit fabrication surface by means of etching using plasma processing, into semiconductor chips made up of respective semiconductor devices, the method comprising:
   a lyophobic pattern formation step of printing a lyophobic liquid on scribe lines serving as borders between semiconductor chips on a processing target surface of the semiconductor wafer that is another side of the circuit fabrication surface, thereby forming a lyophobic pattern;
   a resin film formation step of preparing a first liquid including at least a solvent and a resin and a second liquid whose viscosity is lower than a viscosity of the first liquid and supplying the liquids in descending sequence of the second liquid and the first liquid on the processing target surface of the substrate on which the lyophobic pattern is formed, thereby forming a resin film that is thicker than the lyophobic pattern in an area where the lyophobic pattern is not formed;
   a mask formation step of curing the resin film, to thus form on the processing target surface a mask for covering an area except for the are to be etched away;
   a lyophobic pattern removal step of removing the lyophobic pattern from the processing target surface after performance of processing pertaining to the mask formation step;
   an etching step of etching the semiconductor wafer from the processing target surface thereof until the protective sheet becomes exposed on the processing target surface, after processing pertaining to the lyophobic pattern removal step; and
   a mask removal step of removing the mask from the processing target surface after completion of processing pertaining to the etching step.

6. The semiconductor chip manufacturing method according to claim 5, wherein the second liquid includes the same solvent as that of the first liquid.

7. The semiconductor chip manufacturing method according to claim 6, wherein the second liquid includes the same resin as that of the first liquid, and the resin in the second liquid is lower in concentration than the resin in the first liquid.

8. The semiconductor chip manufacturing method according to claim 5, wherein the second liquid includes a liquid that differs in type from a solvent of the first liquid and that exhibits a property of being dissolved in the first liquid.

9. A resin-adhesive-layer-backed semiconductor chip manufacturing method for manufacturing semiconductor chips having on rear surfaces resin adhesive layers for die-bonding purpose by means of plasma dicing for separating a semiconductor wafer, which has a plurality of semiconductor devices on a circuit fabrication surface and which is affixed with a protective sheet for protecting the circuit fabrication surface, into respective semiconductor devices by means of etching using plasma processing, the method comprising:
   a lyophobic pattern formation step of printing a lyophobic liquid on scribe lines serving as borders between semiconductor chips on a rear surface of the semiconductor wafer that is another side of the circuit fabrication surface, thereby forming a lyophobic pattern;
   a resin film formation step of preparing a first liquid including at least a solvent and a resin and a second liquid whose viscosity is lower than a viscosity of the first liquid and supplying the liquids in descending sequence of the second liquid and the first liquid on the processing target surface of the substrate on which the lyophobic pattern is formed, thereby forming a resin film that is thicker than the lyophobic pattern in an area where the lyophobic pattern is not formed;

a resin adhesive layer formation step of semi-curing the resin film, to thus form a resin adhesive layer;

a lyophobic pattern removal step of removing the lyophobic pattern from the rear surface after performance of processing pertaining to the resin adhesive layer formation step; and an etching step of etching, after performance of processing pertaining to the lyophobic pattern removal step, the semiconductor wafer from the rear surface thereof while the resin adhesive layer is taken as a mask until the protective sheet becomes exposed on the rear surface.

10. The resin-adhesive-layer-backed semiconductor chip manufacturing method according to claim 9, wherein the second liquid includes the same solvent as that of the first liquid.

11. The resin-adhesive-layer-backed semiconductor chip manufacturing method according to claim 10, wherein the second liquid includes the same resin as that of the first liquid, and the resin in the second liquid is lower in concentration than the resin in the first liquid.

12. The resin-adhesive-layer-backed semiconductor chip manufacturing method according to claim 9, wherein the second liquid includes a liquid that differs in type from a solvent of the first liquid and that exhibits a property of being dissolved in the first liquid.

* * * * *